(12) United States Patent
Ohbayashi

(10) Patent No.: US 7,445,813 B2
(45) Date of Patent: Nov. 4, 2008

(54) METHOD FOR FORMING THIN FILMS AND APPARATUS THEREFOR

(75) Inventor: Yasushi Ohbayashi, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 0 days.

(21) Appl. No.: 10/482,370

(22) PCT Filed: Jul. 3, 2002

(86) PCT No.: PCT/JP02/06729

§ 371 (c)(1),
(2), (4) Date: Dec. 30, 2003

(87) PCT Pub. No.: WO03/005077

PCT Pub. Date: Jan. 16, 2003

(65) Prior Publication Data

US 2004/0191407 A1 Sep. 30, 2004

(30) Foreign Application Priority Data

Jul. 4, 2001 (JP) .............................. 2001-203882

(51) Int. Cl.
*C23C 16/00* (2006.01)
*C23C 16/40* (2006.01)
*C23C 16/06* (2006.01)
(52) U.S. Cl. .............................. 427/248.1; 427/255.15; 427/255.19; 427/255.32
(58) Field of Classification Search ............ 427/255.15, 427/255.19, 255.32
See application file for complete search history.

(56) References Cited

U.S. PATENT DOCUMENTS 5,872,655 A * 2/1999 Seddon et al. ............... 359/588
5,911,856 A 6/1999 Suzuki et al.

FOREIGN PATENT DOCUMENTS

| EP | 0 552 648 A1 | 7/1993 |
|---|---|---|
| EP | 552648 A1 * | 7/1993 |
| JP | 05249312 A * | 9/1993 |
| JP | A 6-240440 | 8/1994 |
| JP | A 10-332931 | 12/1998 |
| JP | A 2000-171602 | 6/2000 |

* cited by examiner

*Primary Examiner*—Timothy Meeks
*Assistant Examiner*—Kelly M Stouffer
(74) *Attorney, Agent, or Firm*—Oliff & Berridge, PLC

(57) ABSTRACT

A vapor deposition process for depositing TiO2 and a vapor desposition process for depositing SiO2 are alternately repeated in a multi-layer film forming process. A refractive index that a thin film formed by each vapor depositing will provide is individually determined prior to each relative vapor depositing, and vapor deposition control data is prepared based on such a refractive index. Each vapor deposition is controlled by using a relative vapor deposition control data thus prepared. Therefore, each vapor deposition process can be accurately controlled according to the refractive index of a thin film even if repeated vapor deposition processes change the refractive index. Accordingly, a multilayer film having desired optical characteristics can be formed.

3 Claims, 18 Drawing Sheets

DESIGN VALUE FOR BANDPASS FILTER

MEASURED VALUE OF BANDPASS FILTER

ORDER IN WHICH FILEMS ARE FORMED

| ORDER | | REFRACTIVE INDEX | OPTICAL THICKNESS [nm] | |
|---|---|---|---|---|
| | ATMOSPHERE | 1 | | |
| 23 | TiO2 | 2.25 | 150 | (153) |
| 22 | SiO2 | 1.45 | 150 | (153) |
| 21 | TiO2 | 2.25 | 150 | (153) |
| 20 | SiO2 | 1.45 | 150 | (153) |
| 19 | TiO2 | 2.25 | 300 | (306) |
| 18 | SiO2 | 1.45 | 150 | |
| 17 | TiO2 | 2.25 | 150 | |
| 16 | SiO2 | 1.45 | 150 | |
| 15 | TiO2 | 2.25 | 150 | |
| 14 | SiO2 | 1.45 | 150 | |
| 13 | TiO2 | 2.25 | 150 | |
| 12 | SiO2 | 1.45 | 150 | |
| 11 | TiO2 | 2.25 | 150 | |
| 10 | SiO2 | 1.45 | 150 | |
| 9 | TiO2 | 2.25 | 150 | |
| 8 | SiO2 | 1.45 | 150 | |
| 7 | TiO2 | 2.25 | 300 | |
| 6 | SiO2 | 1.45 | 150 | |
| 5 | TiO2 | 2.25 | 150 | |
| 4 | SiO2 | 1.45 | 150 | |
| 3 | TiO2 | 2.25 | 150 | |
| 2 | SiO2 | 1.45 | 150 | |
| 1 | TiO2 | 2.25 | 150 | |
| | SUBSTRATE | 1.52 | | |

CHANGE IN AMOUNT OF REFLECTED LIGHT DURING TiO₂ VAPOR DEPOSITION (n=2.245)

CHANGE IN AMOUNT OF REFLECTED LIGHT DURING SiO₂ VAPOR DEPOSITION (n=1.45)

FIG.12

TABLE OF CHANGE IN AMOUNT OF LIGHT
(COMPARATIVE EXAMPLE)

| ORDER i | REFRACTIVE INDEX n(i) | OPTICAL THICKNESS A(i) | MEASURING WAVELENGTH $\lambda$ | INITIAL VALUE Io(i) | PEAK Im(i) | TARGET VALUE D(i) |
|---|---|---|---|---|---|---|
| 1 | 2.245 | 150 | 555 | 20 | 75.851 | 75.171 |
| 2 | 1.45 | 150 | 555 | 90 | 73.060 | 73.338 |
| 3 | 2.245 | 150 | 555 | 20 | 75.851 | 75.171 |
| 4 | 1.45 | 150 | 555 | 90 | 73.060 | 73.338 |
| 5 | 2.245 | 150 | 555 | 20 | 75.851 | 75.171 |
| 6 | 1.45 | 150 | 555 | 90 | 73.060 | 73.338 |
| 7 | 2.245 | 150 | 555 | 20 | 75.851 | 75.171 |
| 8 | 1.45 | 150 | 555 | 90 | 73.060 | 73.338 |
| 9 | 2.245 | 150 | 555 | 20 | 75.851 | 75.171 |
| 10 | 1.45 | 150 | 555 | 90 | 73.060 | 73.338 |
| 11 | 2.245 | 150 | 555 | 20 | 75.851 | 75.171 |
| 12 | 1.45 | 150 | 555 | 90 | 73.060 | 73.338 |
| 13 | 2.245 | 150 | 555 | 20 | 75.851 | 75.171 |
| 14 | 1.45 | 150 | 555 | 90 | 73.060 | 73.338 |
| 15 | 2.245 | 150 | 555 | 20 | 75.851 | 75.171 |
| 16 | 1.45 | 150 | 555 | 90 | 73.060 | 73.338 |
| 17 | 2.245 | 150 | 555 | 20 | 75.851 | 75.171 |
| 18 | 1.45 | 150 | 555 | 90 | 73.060 | 73.338 |
| 19 | 2.245 | 150 | 555 | 20 | 75.851 | 75.171 |
| 20 | 1.45 | 150 | 555 | 90 | 73.060 | 73.338 |

FIG.18

TABLE OF CHANGE IN AMOUNT OF LIGHT
(PREFERRED EMBODIMENT)

| ORDER $i$ | REFRACTIVE INDEX $n(i)$ | OPTICAL THICKNESS $A(i)$ | MEASURING WAVELENGTH $\lambda$ | INITIAL VALUE $Io(i)$ | PEAK $Im(i)$ | TARGET VALUE $D(i)$ |
|---|---|---|---|---|---|---|
| 1 | 2.2450 | 150 | 555 | 20 | 75.851 | 75.171 |
| 2 | 1.4500 | 150 | 555 | 90 | 73.060 | 73.338 |
| 3 | 2.2538 | 150 | 555 | 20 | 76.539 | 75.854 |
| 4 | 1.4508 | 150 | 555 | 90 | 73.235 | 73.510 |
| 5 | 2.2618 | 150 | 555 | 20 | 77.163 | 76.473 |
| 6 | 1.4516 | 150 | 555 | 90 | 73.411 | 73.683 |
| 7 | 2.2690 | 150 | 555 | 20 | 77.724 | 77.029 |
| 8 | 1.4524 | 150 | 555 | 90 | 73.587 | 73.856 |
| 9 | 2.2754 | 150 | 555 | 20 | 78.221 | 77.522 |
| 10 | 1.4532 | 150 | 555 | 90 | 73.764 | 74.030 |
| 11 | 2.2810 | 150 | 555 | 20 | 78.655 | 77.952 |
| 12 | 1.4540 | 150 | 555 | 90 | 73.941 | 74.204 |
| 13 | 2.2858 | 150 | 555 | 20 | 79.026 | 78.321 |
| 14 | 1.4548 | 150 | 555 | 90 | 74.118 | 74.378 |
| 15 | 2.2898 | 150 | 555 | 20 | 79.335 | 78.627 |
| 16 | 1.4556 | 150 | 555 | 90 | 74.296 | 74.553 |
| 17 | 2.2930 | 150 | 555 | 20 | 79.582 | 78.872 |
| 18 | 1.4564 | 150 | 555 | 90 | 74.475 | 74.729 |
| 19 | 2.2954 | 150 | 555 | 20 | 79.767 | 79.056 |
| 20 | 1.4572 | 150 | 555 | 90 | 74.653 | 74.905 |

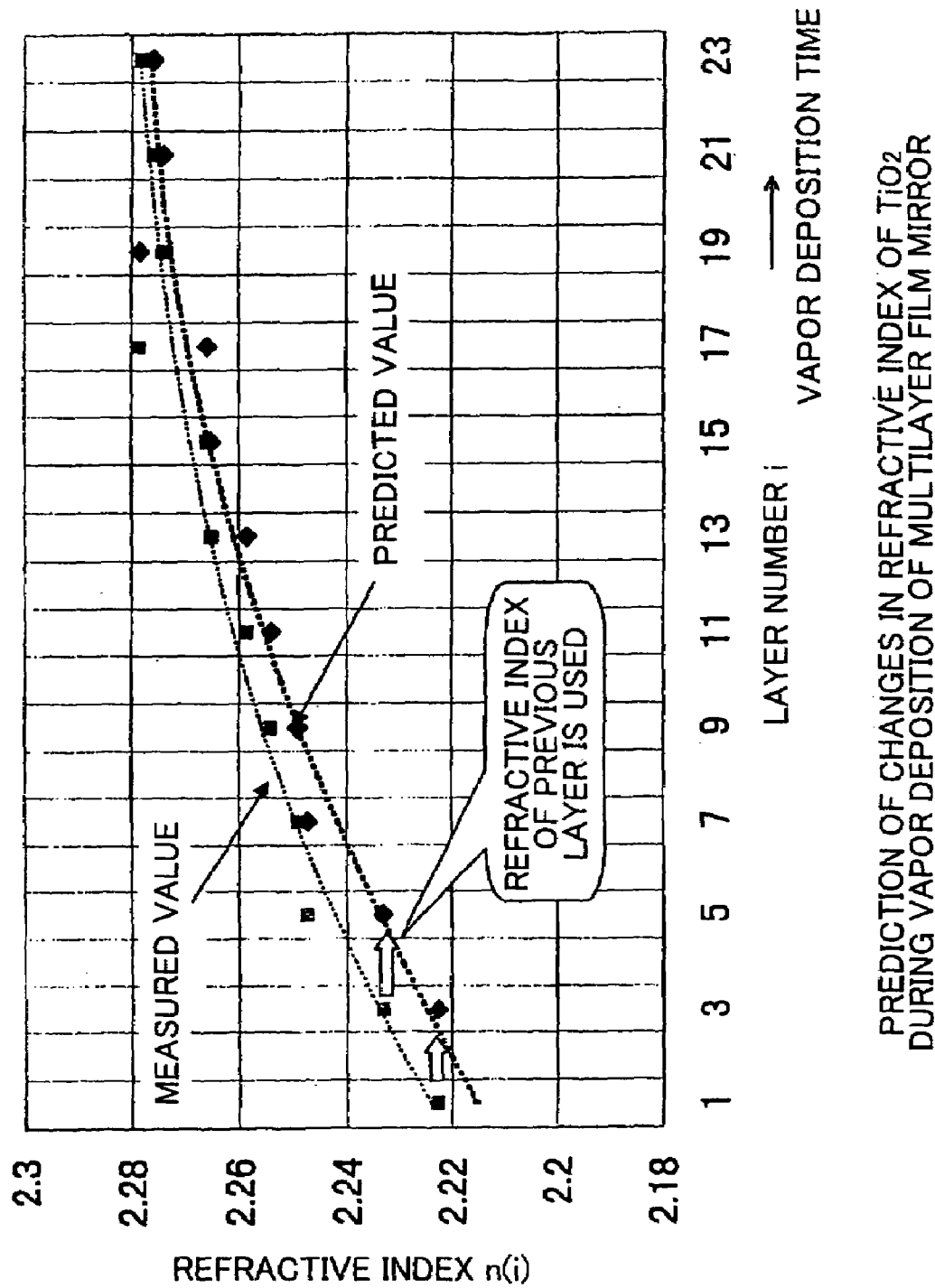

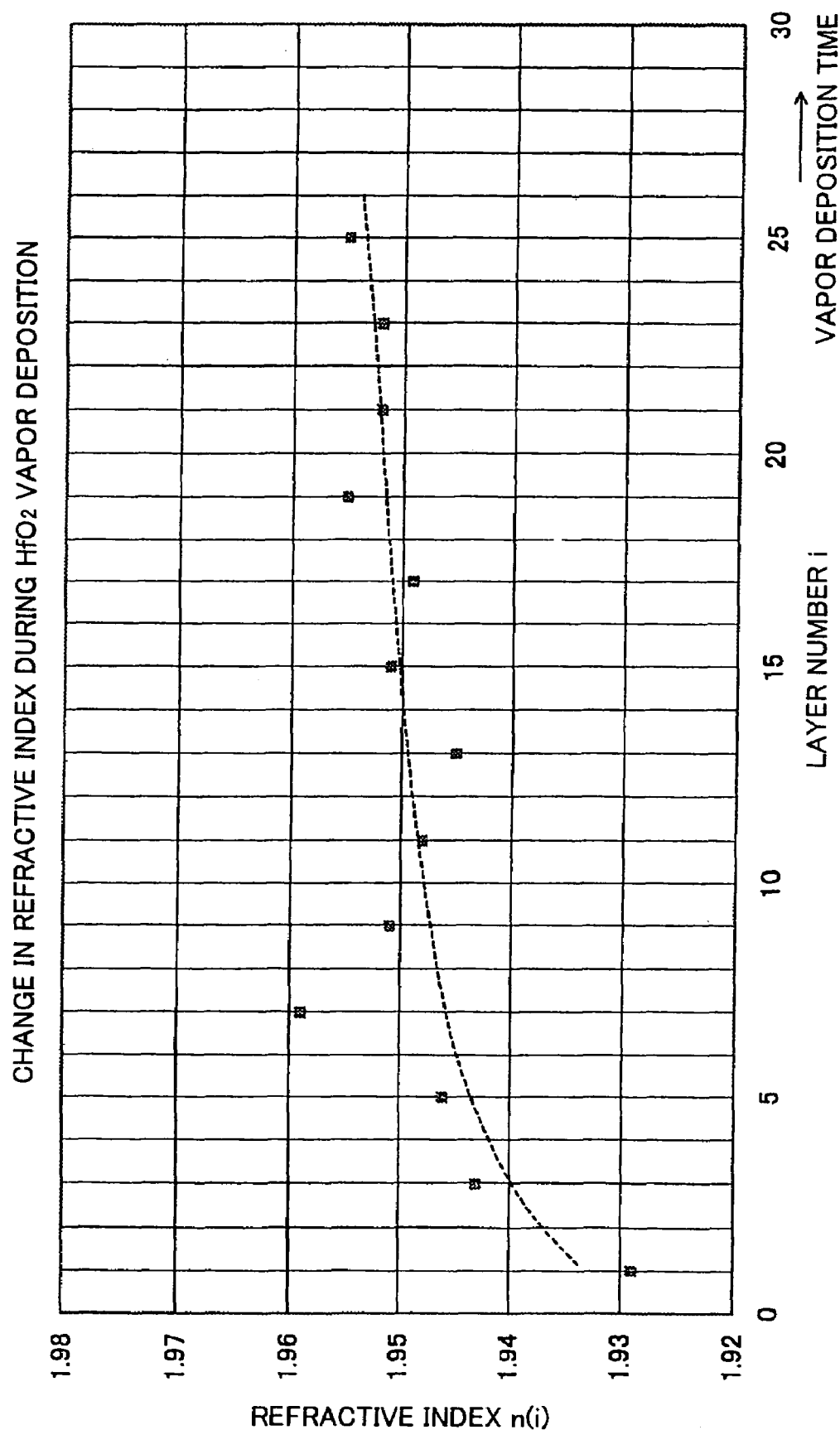

METHOD FOR FORMING THIN FILMS AND APPARATUS THEREFOR

TECHNICAL FIELD

The present invention relates to a method for forming thin films and apparatus therefor, and particularly to such a method for forming multilayer films through vacuum deposition and apparatus therefor.

BACKGROUND ART

A thin film forming method for performing vapor deposition in a vacuum chamber to form a multilayer film is well known in the art.

This thin film forming method forms a multilayer film by alternately and repeatedly performing a vapor deposition process using several materials. By performing vapor deposition alternately and repeatedly using a material having a higher refractive index and a material having a lower refractive index, for example, a multilayer mirror or multilayer bandpass filter can be formed.

In order to form a multilayer film having desired optical characteristics, the film must be deposited so that each layer has a desired optical thickness. Optical thickness in this description is defined as the product of the refractive index and the film thickness.

In the conventional thin film forming method, a substrate to undergo vapor deposition and a substrate for monitoring the process are disposed in a vacuum chamber, and vapor deposition is performed on both substrates simultaneously. During the film forming process, measuring light is irradiated on the monitor substrate to monitor the amount of reflected light. When the amount of reflected light reaches a prescribed value, the vapor deposition is halted.

Each material in this process has a prescribed refractive index inherent in the material. Hence, if thin films of the same material have the same optical thickness, it is likely that the thin films have the same refractive index. When attempting to form multiple layers of thin films having the same optical thickness and using the same material in the thin film forming method of the prior art, the vapor deposition process is continued for each layer until the amount of reflected light reaches the same target value.

Let us consider a case for forming a multilayer bandpass filter having the wavelength transmitting property shown in FIG. 1(a), wherein 23 layers are alternately formed of titanium oxide ($TiO_2$) having a refractive index of about 2.25 and silicon oxide ($SiO_2$) having a refractive index of about 1.45. As shown in FIG. 2, of all 23 film layers, only the seventh and nineteenth $TiO_2$ thin films have an optical thickness of 300 nm, while the rest of thin films have an optical thickness of 150 nm.

When a $TiO_2$ film having a refractive index of about 2.25 has an optical thickness of 300 nm, the reflectance of the thin film is determined by the refractive index. Therefore, in the process for forming the $7^{th}$ and $19^{th}$ layers of the $TiO_2$ film, vapor deposition is continued until the amount of reflected light reaches a prescribed target value corresponding to the reflectance. Further, when the $TiO_2$ layer has an optical thickness of 150 nm, the thin film has a different reflectance. Therefore, in the process for forming the $TiO_2$ layers having an optical thickness of 150 nm, vapor deposition is continued until the amount of reflected light reaches a target value corresponding to the different reflectance. When the $SiO_2$ layer with a refractive index of about 1.45 has an optical thickness of 150 nm, the thin film has a reflectance different from the others. Accordingly, in the process of forming each layer of $SiO_2$ film, vapor deposition is continued until the amount of reflected light reaches a target value corresponding to the reflectance.

DISCLOSURE OF THE INVENTION

However, despite controlling each vapor deposition process based on a target amount of reflected light, the conventional thin film forming method has not been capable of forming a multilayer film with desired optical characteristics.

For example, when an attempt to form a multilayer bandpass filter having the wavelength transmitting properties shown in FIG. 1(a) is done by controlling the vapor deposition process for each layer based on a target value, as described above, the wavelength transmitting properties of the multilayer film are actually less than desirable, as shown in FIG. 1(b).

Therefore, it is an object of the present invention to provide a method for forming thin films and apparatus which are capable of forming a multilayer film having desired optical characteristics.

The inventors of the present invention performed the following simulations. First, in regard to the multilayer bandpass filter having a total of 23 layers with the characteristics shown in FIG. 1(b), the inventors postulated that the optical thickness of the $19^{th}$ through the $23^{rd}$ layers had varied slightly from their desired values (150 or 300 nm) and were in fact the values shown in parentheses in FIG. 2. Specifically, the inventors assumed that the $19^{th}$ layer became 306 nm in thickness, while the $20^{th}$ through $23^{rd}$ layers had become 153 nm. Then computations were performed to simulate what type of bandpass characteristics a multilayer bandpass filter having these optical thicknesses would possess. The resulting bandpass characteristics obtained in the simulation were substantially identical to those in FIG. 1(b).

Based on the results of this simulation, it can be inferred that the actual optical thicknesses of the films gradually began to deviate from the desired values.

Therefore, the inventors conducted more experiments, repeatedly performing vapor deposition of the same material while measuring the refractive index of the layers formed by each vapor deposition process. They discovered in these experiments that the refractive index of the layers gradually changed as the vapor deposition process was repeated.

In order to achieve the above object, the present invention provides a method of forming thin films, comprising the steps of forming a multilayer film that alternately repeats one time each a first material vapor deposition step and a second material vapor deposition step, the first material vapor deposition step for depositing a first material to form a first thin film, and the second material vapor deposition step for depositing a second material to form a second thin film, each of the first and second material vapor deposition steps being executed based on deposition control data, stored in a deposition control data storage unit, and a measuring result obtained by measuring the first and second thin films to be formed with a prescribed measuring light, performance of the first and second material vapor deposition steps in total a prescribed number of times forming the multilayer film, the multilayer film having in total the prescribed number of layers alternating between the first thin film of the first material and the second thin film of the second material; and obtaining deposition control data, comprising the steps of: determining a refractive index for the first thin film to be formed in each of the first material vapor deposition steps individually prior to executing the corresponding first material vapor deposition step, and obtaining the deposition control data to be used in the corresponding first material vapor deposition step based on the determined refractive index prior to executing the corresponding first material vapor deposition step to store the deposition control data in the deposition control data storage unit.

Hence, in the multilayer forming process, a first material vapor deposition process for depositing a first material and a second material vapor deposition process for depositing a second material are repeatedly and alternately executed in a vacuum chamber. The first material vaporized in each first material vapor deposition process is condensed to form a thin film. The thin film is measured using a prescribed measuring light, and the first material vapor deposition process is controlled based on the measurement results and deposition control data. The second material vaporized in each second material vapor deposition process is condensed to form a thin film. The thin film is measured using a prescribed measuring light, and the second material vapor deposition process is controlled based on the measurement results and deposition control data. Evacuation of the vacuum chamber is initiated prior to beginning the multilayer forming process, and is continuously evacuated while performing the multilayer forming process. Evacuation is ended after completing the multilayer forming process.

In the present invention, a predicted-refractive index of a thin film formed by the first material vapor deposition process is predetermined individually prior to executing each vapor deposition operation. Deposition control data is formed based on this refractive index. The current first material vapor deposition operation is controlled using this deposition control data. Accordingly, each first material vapor deposition process can be precisely controlled based on the refractive index, even when the refractive index for a thin film of the first material fluctuates when the first material vapor deposition process has been repeatedly performed a plurality of times. Hence, a multilayer film having the desired characteristics can be formed.

Here, a process to create deposition control data may generate the deposition control data to be used in each first material vapor deposition process based on the refractive index determined for the process and the desired optical thickness of the thin film to be formed by the first material vapor deposition process. Since each first material vapor deposition process can be controlled by the deposition control data corresponding to the refractive index of the thin film to be formed in the process, a multilayer film having the desired optical thickness and the desired characteristics can be formed precisely.

The multilayer film forming process further comprises a process for disposing substrates for multilayer film forming in a vacuum chamber. Each of the first and second material vapor deposition processes preferably includes a process for replacing an existing monitor substrate in the vacuum chamber with a new monitor substrate; a vapor deposition process for forming a thin film on the substrate subject to multilayer film forming and the monitor substrate in the vacuum chamber by simultaneously depositing the corresponding material; a measuring process for irradiating a prescribed measuring light on the monitor substrate during the vapor deposition process and measuring the effects of the thin film formed on the monitor substrate on the measuring light to obtain a measuring result; and a controlling process for continuing the vapor deposition process until the results of the measuring process achieve a prescribed relationship with deposition control data and for ending the vapor deposition process when the prescribed relationship is achieved.

More specifically, in each of the first and second material vapor deposition processes, the measuring light is irradiated on the thin films while the amount of light reflected from the thin film and the amount of light transmitted therethrough are measured. During the first and second material vapor deposition processes, thin films are formed simultaneously on the substrate for multilayer film formation and the monitor substrate through vapor deposition. After each layer is deposited, the monitor substrate is replaced with a new substrate. Therefore, only one layer of the thin film is formed for each monitor substrate. Measurements are obtained for the thin films by irradiating a prescribed light on the monitor substrate and measuring the amounts of reflected light and transmitted light. The measurements are compared with the deposition control data. Vapor deposition is continued until the measurement results match the deposition control data. In the present invention, the deposition control data used for each of the first material vapor deposition operations is created in advance based on the refractive index of the thin film to be formed. Accordingly, the vapor deposition operation can be stopped at the point that the thin film achieves a desired optical thickness.

If the refractive index of the thin films being formed of the second material does not fluctuate significantly, even when the vapor deposition process is repeated a plurality of times, the refractive index for all layers being formed may be set to the same value. The deposition control data used for forming these layers may be created based on this refractive index.

However, a deposition control data creating process can determine the refractive index for the thin film to be formed individually for each second material vapor deposition process and prior to executing each process. The deposition control data to be used in each second material vapor deposition process can be created based on the determined refractive index prior to executing each second material vapor deposition process and stored in a deposition control data storage unit.

For example, if the refractive index of a thin film formed of the second material fluctuates as the vapor deposition operation is repeatedly executed, preferably the refractive index of the thin film to be formed in the second material vapor deposition process is determined separately prior to executing each second material vapor deposition process, and deposition control data is created based on this refractive index and the desired optical thickness of the thin film for each second material vapor deposition process. By using this deposition control data in the corresponding vapor deposition process, each layer of the second material can be deposited precisely. Since each second material vapor deposition process can be controlled based on deposition control data corresponding to the refractive index of the thin film to be formed in the vapor deposition process, a multilayer film having a desired optical thickness and desired characteristics can be more accurately formed.

The second material may be formed of a lot of different materials. In such a case, the second material vapor deposition process includes a lot of vapor deposition processes. In each vapor deposition process, a thin film is formed by depositing the corresponding material. Accordingly, the multilayer film forming process repeatedly executes in sequence the first material vapor deposition process and the other plurality of vapor deposition processes. By executing each of the plurality of deposition processes in sequence, a multilayer film including sequential layers of the first material and a lot of other materials is formed.

The method of the present invention can form at least each layer of the first material at a desired optical thickness, enabling the formation of a multilayer optical film having the desired optical characteristics, such as a multilayer mirror or a multilayer filter. Titanium oxide ($TiO_2$) may be used as the first material, while silicon dioxide ($SiO_2$) may be used as the second material. In fact, most any material may be used as the first and second materials, such as hafnium oxide ($HfO_2$), tantalum pentoxide ($Ta_2O_5$), zirconium oxide ($ZrO_2$), aluminum oxide ($Al_2O_3$), magnesium oxide (MgO), yttrium oxide ($Y_2O_3$), cerium oxide ($CeO_2$), niobium pentoxide ($Nb_2O_5$), bismuth oxide ($Bi_2O_3$), neodymium oxide ($Nd_2O_3$), antimony oxide ($Sb_2O_3$), scandium oxide ($Sc_2O_3$), tungsten oxide ($WO_3$), indium oxide ($In_2O_3$), tin oxide ($SnO_2$), and zinc oxide (ZnO).

The deposition control data creating process preferably includes a process executed After completing each of the first material vapor deposition processes for determining the refractive index of the thin film formed each of the first material vapor deposition processes based on measurements of the thin film, for determining the refractive index of the thin film to be formed in the next first material vapor deposition process based on this determined refractive index, and for creating deposition control data to be used by the next first material vapor deposition process based on the determined refractive index.

The thin film obtained in each first material vapor deposition process is measured with a measuring light, and the refractive index of the thin film is determined based on the measurements. The refractive index of the thin film to be formed in the next first material vapor deposition process can then be determined based on the refractive index determined above.

Here, the deposition control data creating process creates deposition control data to be used in the next first material vapor deposition process based on a refractive index of the thin film formed in the current process and the desired optical thickness of the thin film to be formed in the next process.

For example, the value of the refractive index for the thin film to be formed in the next first material vapor deposition process can be set substantially the same as the refractive index of the thin film formed in the current first material vapor deposition process. The deposition control data to be used in the next first material vapor deposition process is created based on the refractive index determined in this way and the desired optical thickness of the thin film to be created. Hence, the refractive index of the thin film likely to be obtained in the next first material vapor deposition process is set based on the refractive index of the thin film formed in the current first material vapor deposition process, and deposition control data is created for controlling the next first material vapor deposition process. Accordingly, deposition control data can be easily and accurately created, enabling the formation of a multilayer film having the desired characteristics.

The deposition control data creating process further has a preliminary thin film forming process and a data creating process. The preliminary thin film forming process alternately and repeatedly performs a first material preliminary vapor deposition process for forming a thin film by vaporizing a first material and a second material preliminary vapor deposition process for forming a thin film by vaporizing a second material; measures the thin films formed in the first and second material vapor deposition processes using a measuring light while executing the above processes; and executes the first and second material preliminary vapor deposition processes a prescribed number of times in total. The data creating process determines the refractive index of the thin film created in each first material preliminary vapor deposition process based on preliminary measurements indicating measurements of the thin film created in each first material preliminary vapor deposition process; determines the refractive index of the thin film that can be obtained in a corresponding first material vapor deposition process of the multilayer film forming process; and creates deposition control data to be used in the corresponding first material vapor deposition process based on the refractive index determined for the thin film.

In this way, the preliminary thin film forming process can be performed prior to executing the multilayer film forming process. As in the multilayer film forming process, evacuation of the vacuum chamber is initiated prior to starting the preliminary thin film forming process and this evacuation continues during the process. After completing the preliminary thin film forming process, evacuation is halted.

The thin film obtained in each first material preliminary vapor deposition process is measured with a measuring light, and the refractive index of the thin film formed with the material is determined based on these measurements. Based on the refractive index determined in this way, the refractive index for a thin film to be created in a corresponding first material vapor deposition process in the multilayer film forming process is determined.

Here, the data creating process creates deposition control data to be used in the first material vapor deposition process corresponding to the first material preliminary vapor deposition process based on the refractive index of the thin film formed in each first material preliminary vapor deposition process and the desired optical thickness of the thin film to be formed in the corresponding first material vapor deposition process.

For example, a value substantially equal to the refractive index of a thin film obtained in each first material preliminary vapor deposition process can be set as the refractive index for the thin film to be formed in the corresponding first material vapor deposition process of the multilayer film forming process. The deposition control data to be used in this corresponding first material vapor deposition process can be created based on the refractive index determined for the thin film and the desired optical thickness of the thin film to be formed in the corresponding process.

More specifically, values substantially equivalent to refractive indexes for thin films obtained in the corresponding $1^{st}$, $2^{nd}$, . . . first material preliminary vapor deposition processes of the preliminary thin film forming process are set to the refractive indexes of thin films to be formed in the $1^{st}$, $2^{nd}$, . . . first material vapor deposition processes of the multilayer film forming process. The deposition control data to be used in the $1^{st}$, $2^{nd}$, . . . first material vapor deposition processes is created based on the refractive index expected to be obtained in each first material vapor deposition process.

Accordingly, the preliminary thin film forming process is first executed; a refractive index for the thin film expected to be obtained in the corresponding first material vapor deposition process of the multilayer film forming process is set; and deposition control data for controlling the corresponding first material vapor deposition process is created. In this way, a multilayer film having the desired characteristics can be formed using the deposition control data created above.

From another aspect, the present invention provides a thin film forming method comprising a multilayer film forming process for repeatedly performing a material vapor deposition process to form a single thin film by vaporizing a single type of material and repeating this process once each for a lot of types of materials in a prescribed order, for executing each material vapor deposition process for each material based on deposition control data and measurements obtained by measuring the thin film to be formed in the corresponding material vapor deposition process using a prescribed measuring light, and for forming a multilayer film in which the thin films of a lot of types of materials form a lot of prescribed layers in the prescribed order by executing the material vapor deposition process with a lot of types of materials a prescribed number of times in the prescribed order; and a deposition control data stored in a deposition control data storage unit creating method for determining the refractive index of the thin film to be created in each material vapor deposition process for at least one type of material among a lot of types individually and prior to executing the corresponding material vapor deposition process, and for creating deposition control data to be used in each material vapor deposition process for at least the one type of material prior to executing the corresponding material vapor deposition process based on the refractive index determined above and the desired optical thickness of the thin film to be formed in the corresponding material vapor deposition process to store the deposition control data in the deposition control data storage unit.

The deposition control data creating process can determine the refractive index of the thin film to be formed in each material vapor deposition process corresponding to all of the plurality of types of materials individually and prior to executing the corresponding material vapor deposition process. The deposition control data creating process may create deposition control data to be used in each material vapor deposition process prior to executing the corresponding material vapor deposition process based on the index determined above and the desired optical thickness of the thin film to be formed in the corresponding material vapor deposition process.

From another aspect, the present invention provides a thin film forming apparatus having a vacuum deposition device and a control device for controlling the vacuum deposition device. The vacuum deposition device has a deploying unit for deploying a desired substrate; a material vaporizing unit for vaporizing a first material and a second material to be deposited on the deploying unit; and a measuring unit for detecting a prescribed measuring light irradiated on the deploying unit. The controlling device has a vapor deposition control data creating unit for creating vapor deposition control data; a vapor deposition control data storage unit for storing the vapor deposition control data; and a multilayer film forming control unit for forming a multilayer film by performing vapor deposition in the vacuum deposition device based on the vapor deposition control data stored in the vapor deposition control data storage unit. The multilayer film forming control unit controls the material vaporizing unit to alternately and repeatedly perform a first material vapor deposition operation for depositing the first material on the deploying unit and a second material vapor deposition operation for depositing the second material on the deploying unit; for executing each first and second material vapor deposition operation based on measurements obtained by the measuring unit and the deposition control data; and for forming a multilayer film including a prescribed number of layers alternating between a thin film of the first material and a thin film of the second material by executing the first material vapor deposition operation and the second material vapor deposition operation the prescribed number of times in total. The deposition control data creating unit determines the refractive index for a thin film to be created in each first material vapor deposition operation separately and prior to executing the corresponding first material vapor deposition operation; and for creating deposition control data to be used in the first material vapor deposition operation prior to executing the first material vapor deposition process based on the refractive index determined above to store this deposition control data in the deposition control data storage unit.

In each of the first material vapor deposition operations, the vaporized first material is condensed to form a thin film. This thin film is measured using a prescribed measuring light, and the corresponding first material vapor deposition process is controlled based on the measurement results and the deposition control data. In each of the second material vapor deposition operations, the vaporized second material is condensed to form a thin film. This thin film is measured using a prescribed measuring light, and the corresponding second material vapor deposition process is controlled based on the measurement results and the deposition control data.

In the present invention, the refractive index of the thin film to be formed in each first material vapor deposition operation is determined separately and prior to executing the corresponding first material vapor deposition operation. Deposition control data is created based on this refractive index and stored. Therefore, each first material vapor deposition operation can be precisely controlled based on the refractive index, even if the refractive index of a thin film to be formed of the first material changes as the first material vapor deposition operation is executed repeatedly a plurality of times. Accordingly, a multilayer film having desired characteristics can be formed.

Here, the deposition control data creating unit can create deposition control data to be used in the first material vapor deposition operation based on the refractive index determined above and a desired optical thickness of the thin film to be formed in the corresponding first material vapor deposition operation. Since the thin film forming apparatus of the present invention can control each first material vapor deposition operation according to the deposition control data corresponding to the refractive index of the thin film to be formed in the corresponding first material vapor deposition operation, a multilayer film having the desired optical thickness and the desired characteristics can be accurately formed.

Here, the deposition control data creating unit can determine the refractive index of the thin film to be created in each of the plurality of second material vapor deposition operations separately and prior to executing the corresponding second material vapor deposition operation. The deposition control data creating unit can create deposition control data to be used in the corresponding second material vapor deposition operation prior to executing the corresponding second material vapor deposition process based on the refractive index determined above to store this deposition control data in the deposition control data storage unit.

More specifically, the deposition control data used in each second material vapor deposition operation can be created based on the refractive index determined above and the optical thickness of the thin film to be created in the corresponding second material vapor deposition process. Since each second material vapor deposition operation can be controlled according to the deposition control data corresponding to the refractive index of the thin film to be formed in the corresponding second material vapor deposition operation, a multilayer film having a desired optical thickness and desired characteristics can be accurately formed. Hence, each second material vapor deposition operation can be accurately controlled according to the refractive index, even if the refractive index of the thin film to be formed of the second material changes as the second material vapor deposition operation is executed repeatedly a plurality of times.

BRIEF DESCRIPTION OF THE DRAWINGS

In the drawings:

FIG. 12 is a table showing changes in quantity of light in a comparative example for forming a multilayer film with alternating layers of $TiO_2$ and $SiO_2$ for a total of 20 layers, assuming all $TiO_2$ layers have a fixed refractive index of 2.245 and all $SiO_2$ layers have a fixed refractive index of 1.45;

FIG. 18 is a table showing changes in quantity of light when forming a multilayer mirror with alternating layers of $TiO_2$ and $SiO_2$ for a total of 20 layers, wherein the reflectance peak and refractive index for each $TiO_2$ layer and $SiO_2$ layer are determined individually in the test process, and the target light quantity for each layer is set individually;

FIG. 21 is a graph showing a multilayer film forming method according to the second embodiment for estimating subsequent changes in refractive index by setting the estimated refractive index for the next $TiO_2$ vapor deposition operation substantially equal to the refractive index determined in the current $TiO_2$ vapor deposition operation; and FIG. 22 is a graph showing gradual changes in the refractive index of each layer of $HfO_2$ when the layers of $HfO_2$ are formed sequentially.

BEST MODE FOR CARRYING OUT THE INVENTION

A method for forming thin films and apparatus therefor according to preferred embodiments of the present invention will be described while referring to FIGS. 3-22.

First Embodiment

A method for forming thin films and apparatus therefor according to a first embodiment of the present invention will be described with reference to FIGS. 3-18.

Figure 1A:
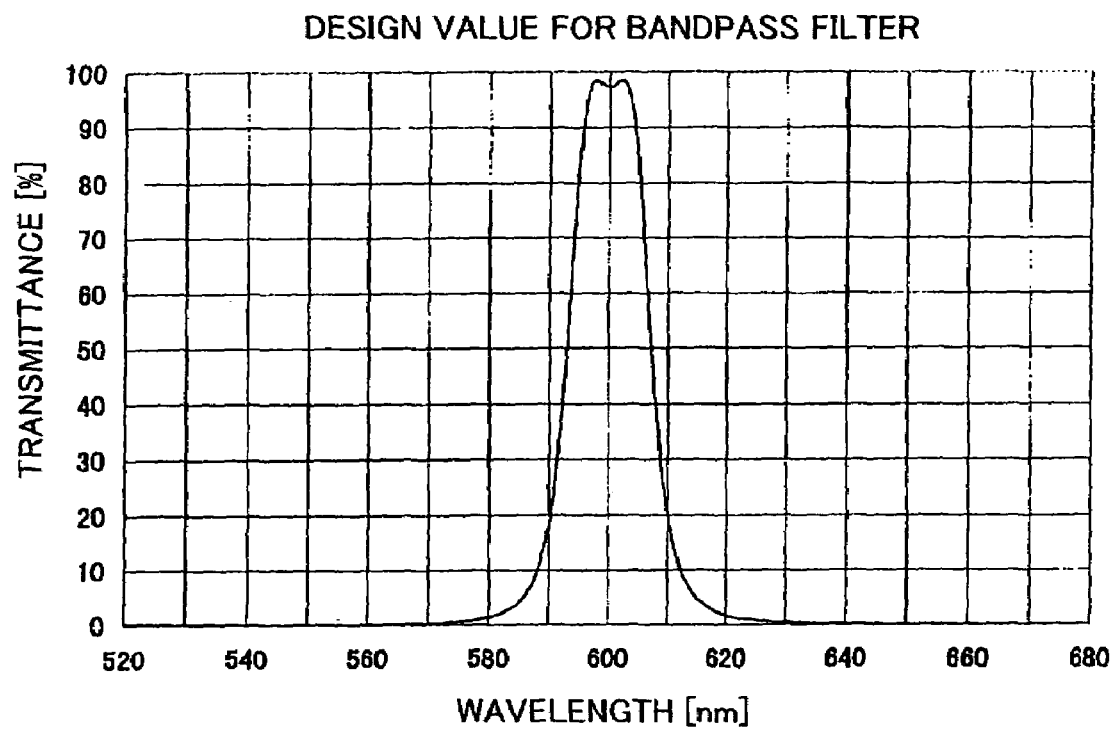
FIG. 1(a) is a graph showing design values for the wavelength transmittance characteristics of a bandpass filter.
Figure 1B:
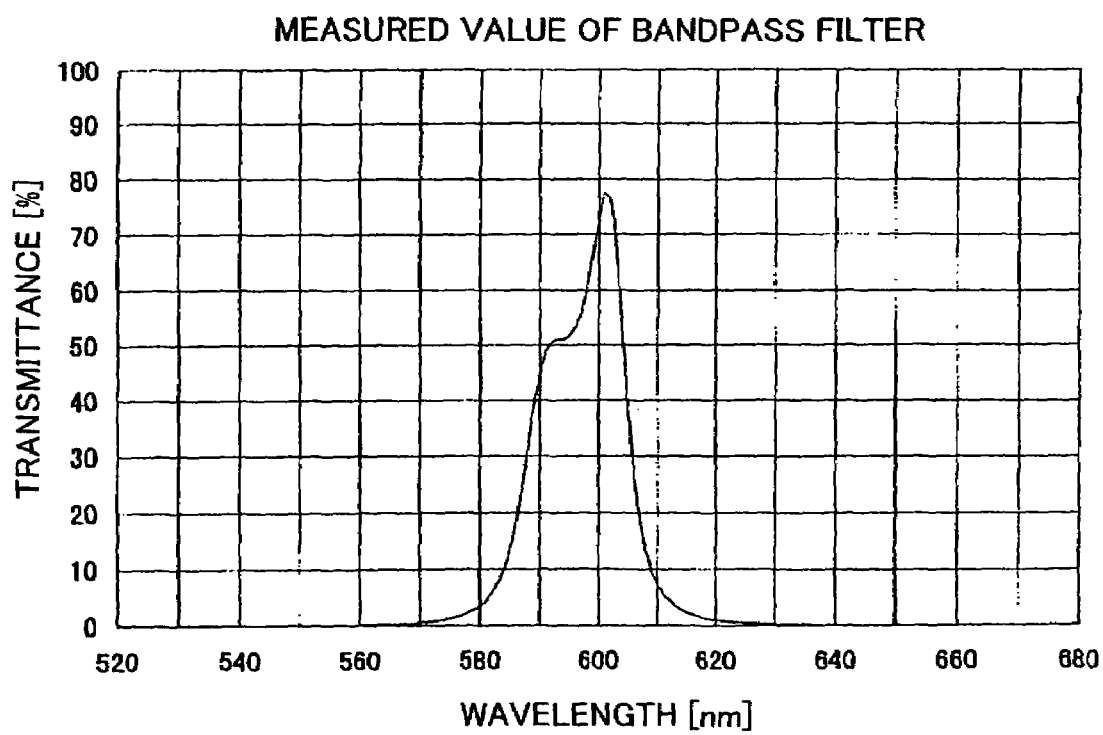
FIG. 1(b) is a graph showing measured values for the wavelength transmittance characteristics of the bandpass filter formed by a conventional thin film forming method.
Figure 2:
FIG. 2 shows the desired optical thickness for $1^{st}$ through $23^{rd}$ layers to be formed in sequence to produce a bandpass filter having the wavelength transmittance characteristics in FIG. 1(a)
Figure 3:
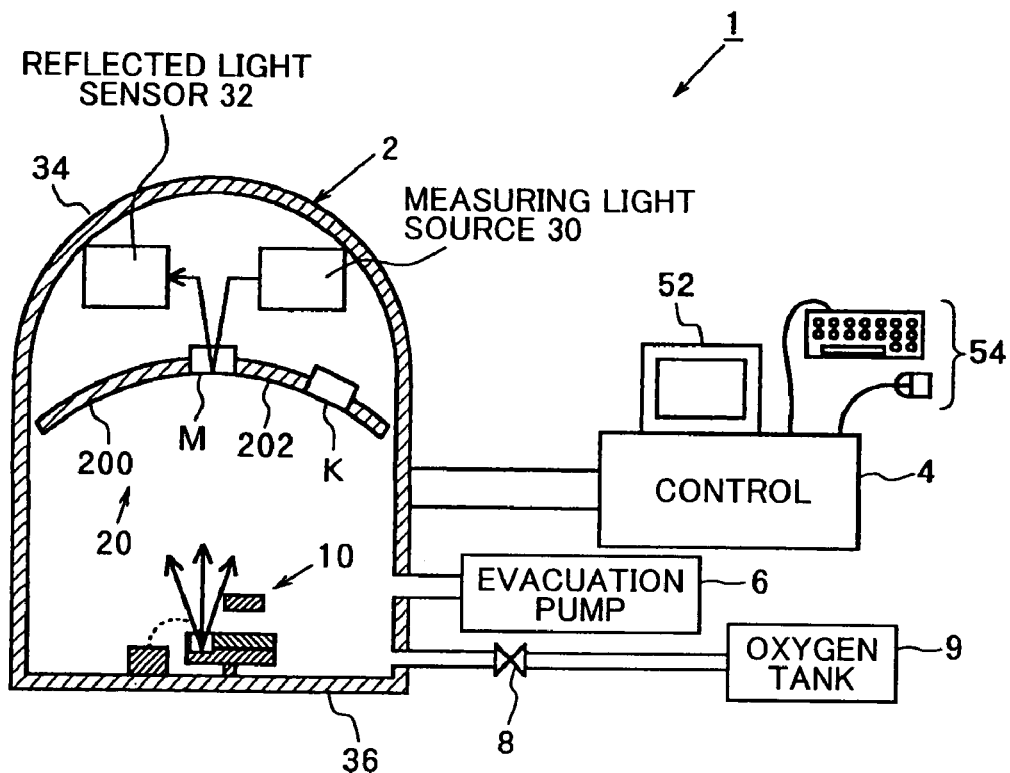
FIG. 3 is a partial cross-sectional view showing the general construction of a thin film forming apparatus according to a first embodiment of the present invention.

FIG. 3 shows a thin film forming apparatus 1 according to the first embodiment of the present invention. The thin film forming apparatus 1 includes a vacuum deposition device 2, and a control device 4 for controlling the vacuum deposition device 2.

The vacuum deposition device 2 includes a vacuum chamber 34. The vacuum chamber 34 is in fluid communication with an evacuation pump 6. The evacuation pump 6 is provided for evacuating the vacuum chamber 34. The vacuum chamber 34 is also in fluid communication with an oxygen tank 9 via an oxygen supply valve 8. Oxygen can be selectively introduced into the vacuum chamber 34 by opening and closing the oxygen supply valve 8.

The vacuum chamber 34 is internally provided with a material vaporizing unit 10, a substrate loading dome 20, a monitor substrate exchanging device 22 (see FIG. 8), a measuring light source 30, and a reflected light sensor 32.

The material vaporizing unit 10 vaporizes a desired material, causing the evaporant to rise upward (upward in FIG. 3). The substrate loading dome 20 is disposed above the material vaporizing unit 10. The substrate loading dome 20 holds a desired substrate K (such as a glass substrate) on which a multilayer film is to be formed and a monitor glass substrate M so that vaporized material is deposited thereon. The monitor substrate exchanging device 22 shown in FIG. 8 functions to exchange the monitor glass substrate M mounted in the substrate loading dome 20. The measuring light source 30 functions to irradiate a measuring light on the monitor glass substrate M. The reflected light sensor 32 functions to detect a quantity of light L in measured light reflected off the monitor glass substrate M.

Figure 4:
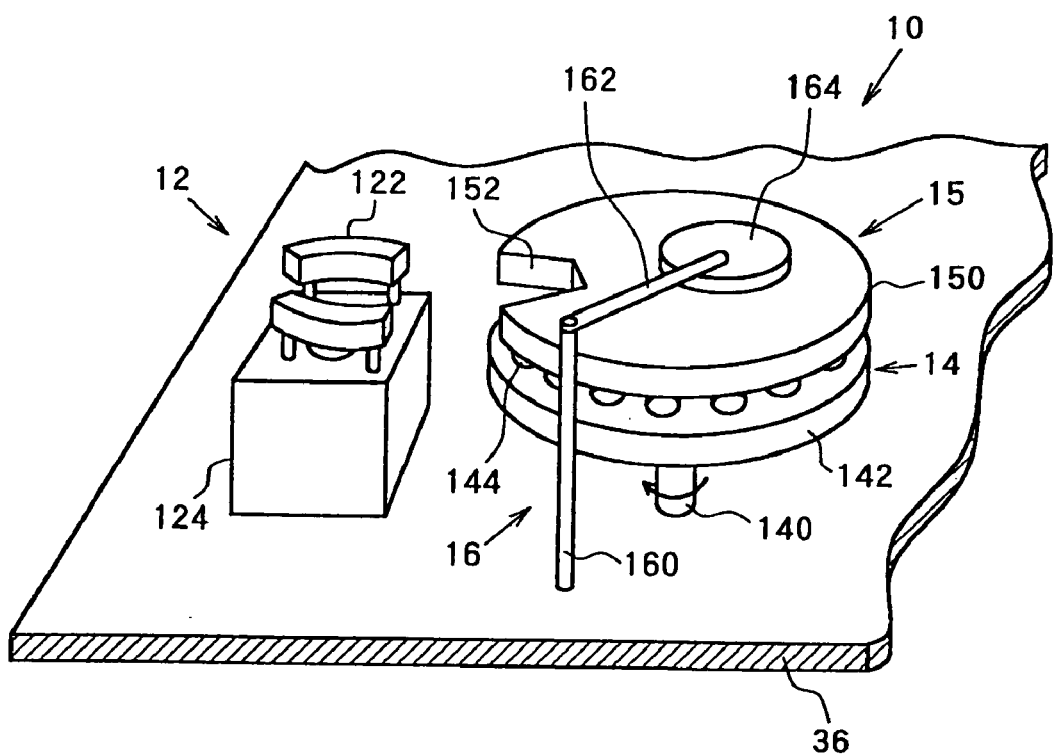
FIG. 4 is a perspective view showing the construction of a material vaporizing unit disposed in a vacuum deposition device of the thin film forming apparatus of FIG. 2.
Figure 5:
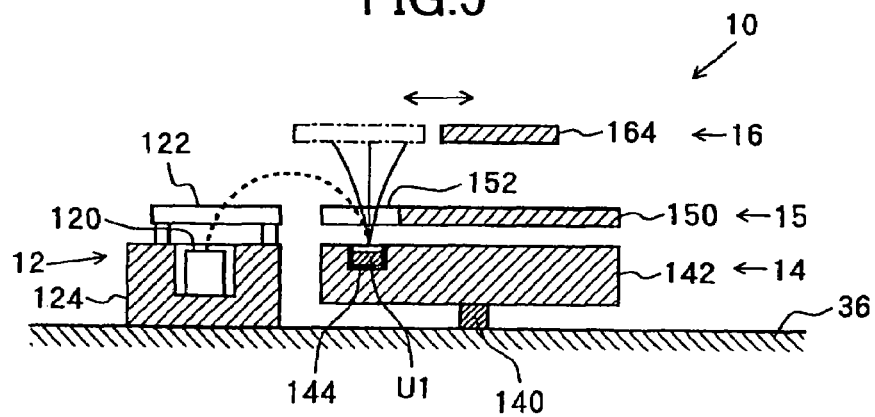
FIG. 5 is a vertical cross-sectional view showing the material vaporizing unit of FIG. 4.

As shown in FIG. 4, the material vaporizing unit 10 includes an electron gun 12, a crucible platform 14, a fixing cover 15, and a shutter 16. FIG. 5 shows a vertical cross section of the material vaporizing unit 10 through the electron gun 12, the crucible platform 14, the fixing cover 15, and the shutter 16.

Figure 6:
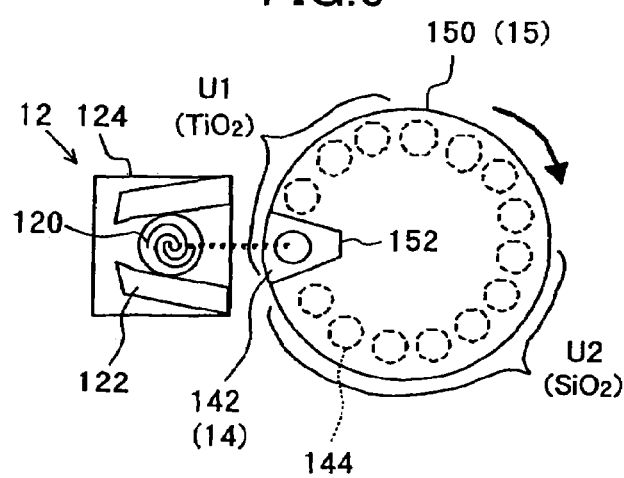
FIG. 6 is a top view of a fixing cover and electron gun in the material vaporizing unit in FIG. 4.

FIG. 6 is a top view of the material vaporizing unit 10 from above, including the electron gun 12, the crucible platform 14, and the fixing cover 15 (with respect to FIG. 4). The shutter 16 has been omitted from this drawing. As shown in FIGS. 4-6, the crucible platform 14 includes a rotating shaft 140 rotatably provided on a bottom portion 36 of the vacuum chamber 34, and a disc-shaped crucible mounting plate 142 that is fixed to and rotates together with the rotating shaft 140. A lot of depressions 144 are formed in the top surface of the crucible mounting plate 142. The depressions 144 are arranged equidistant to one another along the periphery of the crucible mounting plate 142. A crucible accommodating a material for vapor deposition can be mounted in each of the depressions 144. In this embodiment, a total of fifteen depressions 144 are formed in the crucible mounting plate 142, as shown in FIG. 6. Four first crucibles U1 accommodating titanium oxide ($TiO_2$) are mounted in four of the depressions 144, while seven second crucibles U2 accommodating silicon oxide ($SiO_2$) are mounted in seven of the depressions 144.

The fixing cover 15 is disposed above the crucible mounting plate 142 and in a state of non-contact with the same. The fixing cover 15 includes a circular disc 150. The circular disc 150 is fixed by a fixing member (not shown) in relation to the bottom portion 36 of the vacuum chamber 34, so that the center of the circular disc 150 is aligned on the same axis as the rotating shaft 140 of the crucible mounting plate 142. The diameter of the circular disc 150 is approximately equivalent to the diameter of the crucible mounting plate 142. A cutout portion 152 is formed in the periphery of the circular disc 150. With this construction, the fixing cover 15 exposes only a single crucible positioned directly beneath the cutout portion 152, thereby covering all remaining crucibles. Further, by rotating the crucible mounting plate 142, it is possible to change the crucible disposed directly beneath the cutout portion 152.

The electron gun 12 functions to irradiate an electron beam on material that is accommodated in the crucible positioned directly beneath the cutout portion 152. In this embodiment, the electron gun 12 is a 180°-deflection type electron gun. The electron gun 12 includes a filament 120, a pair of deflection polepieces 122, and a casing 124 for holding the filament and the polepieces. The filament 120 is formed in a spiral shape, as shown in FIG. 6, and emits electrons when current is flowed therethrough. The pair of deflection polepieces 122 focus the electrons emitted from the filament 120 to form an electron beam to deflect the beam in a direction toward the crucible positioned directly beneath the cutout portion 152. When the electron beam is irradiated on the deposition material in the crucible, the deposition material is heated until the material melts and vaporizes.

Figure 7:
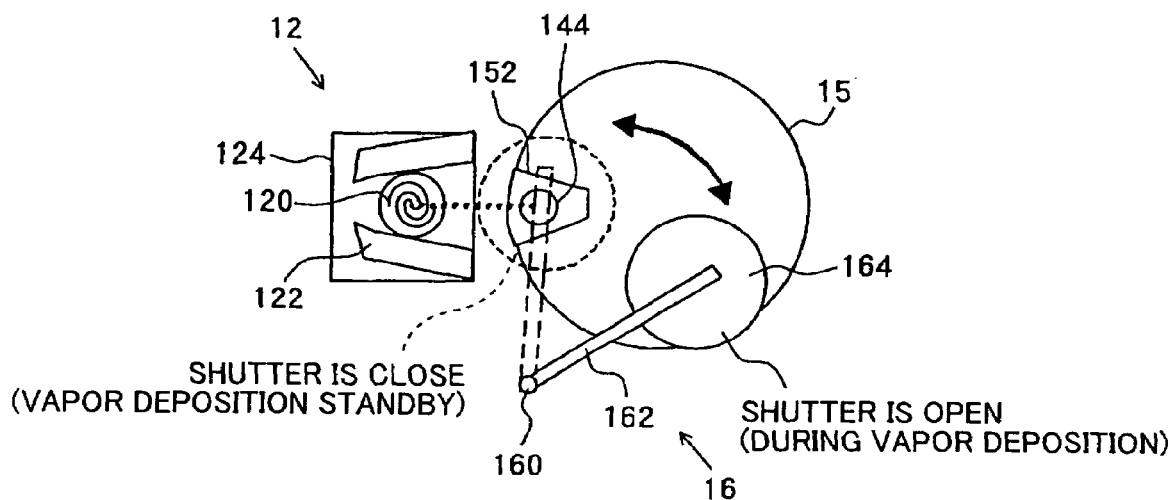
FIG. 7 is a top view of a shutter and the electron gun in the material vaporizing unit in FIG. 4.

FIG. 7 is a top view of the material vaporizing unit 10 from above, including the electron gun 12, the fixing cover 15, and he shutter 16 (with respect to FIG. 4). As shown in FIGS. 4, 5, and 7, the shutter 16 includes a rotating shaft 160 extending from the bottom portion 36 of the vacuum chamber 34, an operating pole 162 fixed to the rotating shaft 160 that angularly rotates along with the same, and a circular blocking disc 164 disposed on the free end of the operating pole 162. The operating pole 162 is fixed to the rotating shaft 160, such that the circular blocking disc 164 is positioned above the fixing cover 15.

During vapor deposition, the rotating shaft 160 is pivotably rotated such that the circular blocking disc 164 is shunted away from a position directly above the cutout portion 152 (open shutter state), as indicated by the solid line in FIGS. 5 and 7. When the deposition process is completed, the rotating shaft 160 is pivotably rotated to return the circular blocking disc 164 to the position directly above the cutout portion 152 (closed shutter state), as indicated by the broken lines in FIGS. 5 and 7.

With this construction, the material vaporizing unit 10 operates as described below.

Prior to beginning vapor deposition, the circular blocking disc 164 is positioned directly above the cutout portion 152, as indicated by the broken lines in FIGS. 5 and 7. In this state, the crucible mounting plate 142 is rotated until a single crucible (U1 or U2) accommodating the deposition material for the next vapor deposition process becomes positioned directly beneath the cutout portion 152. A current is gradually flowed through the filament 120, causing an electron beam to be irradiated on the material in the crucible positioned directly beneath the cutout portion 152. When the current flowing through the filament 120 reaches a prescribed power, the material begins to vaporize. Next, the rotating shaft 160 is pivotably rotated, removing the circular blocking disc 164 from above the cutout portion 152. As a result, the evaporant rushes upward and is deposited, as will be described later. When the vapor deposition process is completed, the rotating shaft 160 is pivotably rotated until the circular blocking disc 164 comes to above the cutout portion 152, thereby blocking the evaporant. At the same time, current flowing through the filament 120 is returned to zero, stopping the electron beam.

Figure 8:
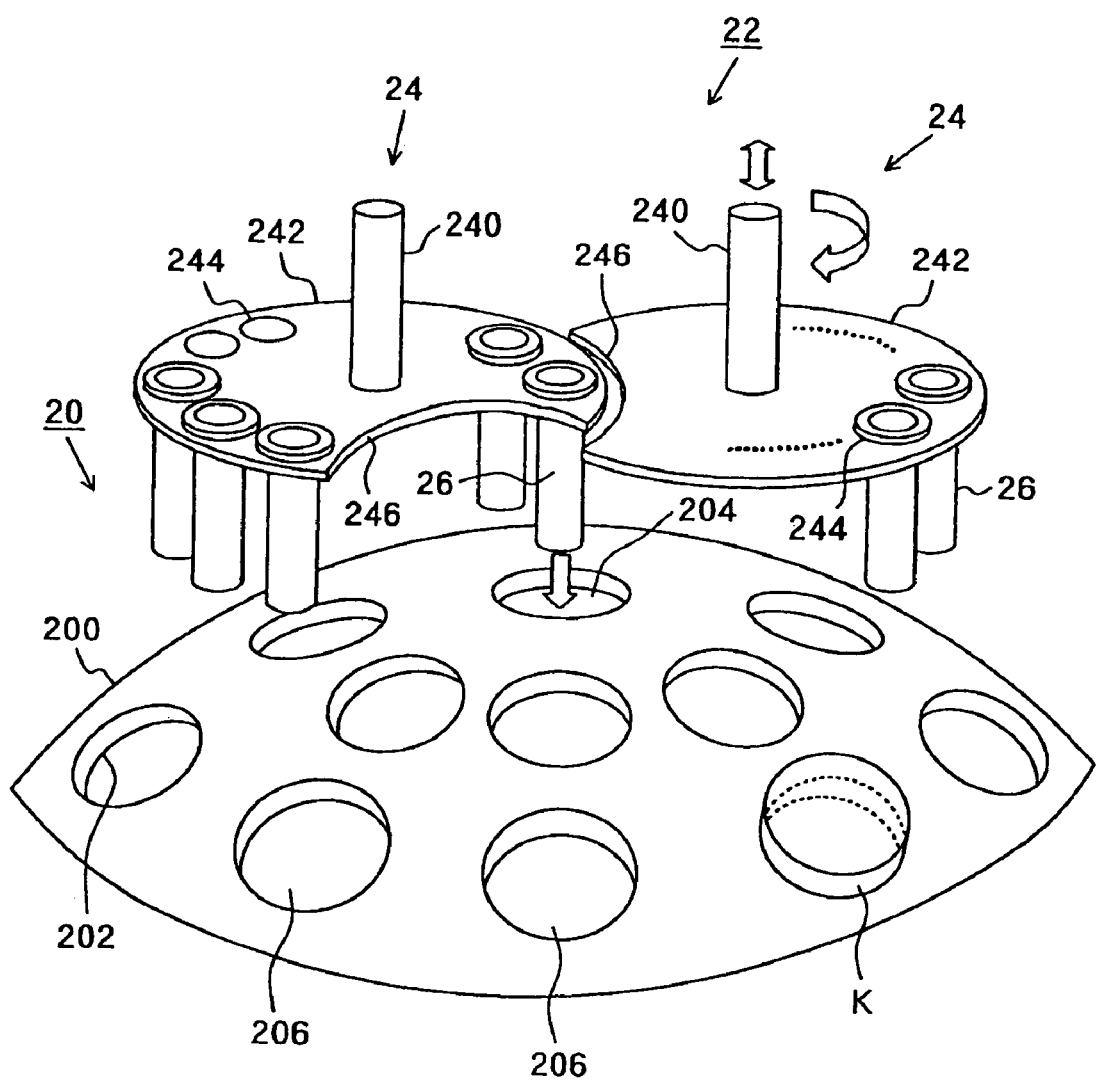
FIG. 8 is a perspective view showing a substrate loading dome from FIG. 3 and a monitor substrate exchanging device disposed above the substrate loading dome.

As shown in FIGS. 3 and 8, the substrate loading dome 20 includes a semispherical plate 200 positioned above the material vaporizing unit 10. The semispherical plate 200 is disposed rotatably with respect to the bottom portion 36 of the vacuum chamber 34 by a holding member (not shown). The semispherical plate 200 has a curved inner surface (hereinafter referred to as a dome surface 202) projecting upward (with respect to FIG. 3). The center of curvature for the dome surface 202 is substantially aligned with the position of the cutout portion 152 formed in the fixing cover 15. A center through-hole 204 is formed in the approximate center of the semispherical plate 200. Several substrate holding through-holes 206 are also formed in the semispherical plate 200.

Substrates K on which multilayer films are to be formed have a disc shape. A single substrate K is held in a single substrate holding through-holes 206, such that the bottom surface of the substrate K (deposition surface) is flush with the dome surface 202. If several substrates K are held in the substrate holding through-holes 206, the substrates K can be simultaneously mounted in the substrate loading dome 20. FIGS. 3 and 8 show a case in which only a single substrate K is mounted in the substrate loading dome 20.

The monitor substrate exchanging device 22 is disposed above the center through-hole 204 of the substrate loading dome 20. A lot of monitor glass substrates M are loaded in the monitor substrate exchanging device 22 to be sequentially fixed in the center through-hole 204 one at a time.

The monitor substrate exchanging device 22 includes two loading devices 24 having identical constructions. Each loading device 24 includes a movable shaft 240 to rotate and move vertically with respect to the bottom portion 36 of the vacuum chamber 34, and a disc 242 fixed to the movable shaft 240 to rotate and move vertically by the movable shaft 240.

Figure 9:
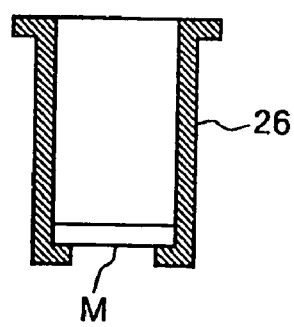
FIG. 9 is a vertical cross-sectional view of a cylindrical holder loaded in the monitor substrate exchanging device of FIG. 8 for holding a monitor substrate in the bottom thereof.

A lot of through-holes 244 are formed in the disc 242. The through-holes 244 are disposed at equal intervals along the periphery of the disc 242. A cylindrical holder 26 is mounted in each of the through-holes 244 to hang down therefrom. As shown in FIG. 9, the disc-shaped monitor glass substrate M is held by the bottom end of the cylindrical holder 26.

A cutout portion 246 is formed in the periphery of each disc 242. During the vapor deposition operation, one of the two loading devices 24 is in an operating state, while the other is in a wait state. In the loading device 24 in the wait state, the movable shaft 240 pivotably rotates to position the cutout portion 246 directly over the center through-hole 204. In the loading device 24 in the operating state, the movable shaft 240 pivotably rotates until one selected cylindrical holder 26 is positioned directly over the center through-hole 204. Next, the movable shaft 240, together with the disc 242, moves downward, causing the cylindrical holder 26 to move downward. The movable shaft 240 stops when the bottom surface of the monitor glass substrate M (deposition surface) held in the cylindrical holder 26 becomes flush with the dome surface 202. In this way, as described for the substrate K, the monitor glass substrate M is loaded into the substrate loading dome 20, such that the deposition surface of the monitor glass substrate M is flush with the dome surface 202.

The measuring light source 30 irradiates a measuring light of a prescribed wavelength λ (such as 555 nm) onto the top surface (the surface opposite the deposition surface) of the monitor glass substrate M loaded in the substrate loading dome 20. The measuring light source 30 includes a white light source and a bandpass filter (not shown). The bandpass filter transmits only light of the prescribed wavelength λ in the white light emitted from the light source. The measuring light of wavelength λ emitted from the measuring light source 30 is reflected by a mirror member (not shown) and then impinged perpendicularly to and on the monitor glass substrate M mounted in the substrate loading dome 20. Measuring light reflected off the monitor glass substrate M is reflected by another mirror member (not shown) to be guided to the reflected light sensor 32.

The reflected light sensor 32 is a photomultiplier tube, for example. The reflected light sensor 32 receives the measuring light reflected off the monitor glass substrate M and to generate an electric signal indicating a quantity of reflected light L.

With the vacuum deposition device 2 having this construction, the electron gun 12 irradiates an electron beam onto $TiO_2$ material in the crucible U1, when the crucible U1 is positioned directly beneath the cutout portion 152. As a result, the $TiO_2$ is melted and vaporized by heat. When the shutter 16 is positioned as shown by the solid line in FIGS. 5 and 7 (open state), the vaporized $TiO_2$ is condensed and deposited on the deposition surfaces of the monitor glass substrate M and the substrate K fixed in the substrate loading dome 20. Similarly, when the crucible U2 is disposed directly beneath the cutout portion 152, $SiO_2$ is condensed and deposited on the monitor glass substrate M and the substrate K. Oxygen tends to escape from $TiO_2$ during deposition $TiO_2$, so that the deposited layer does not have sufficient oxygen. Therefore, when $TiO_2$ is deposited, oxygen is supplied into the vacuum chamber 34 through the oxygen supply valve 8.

Figure 10:
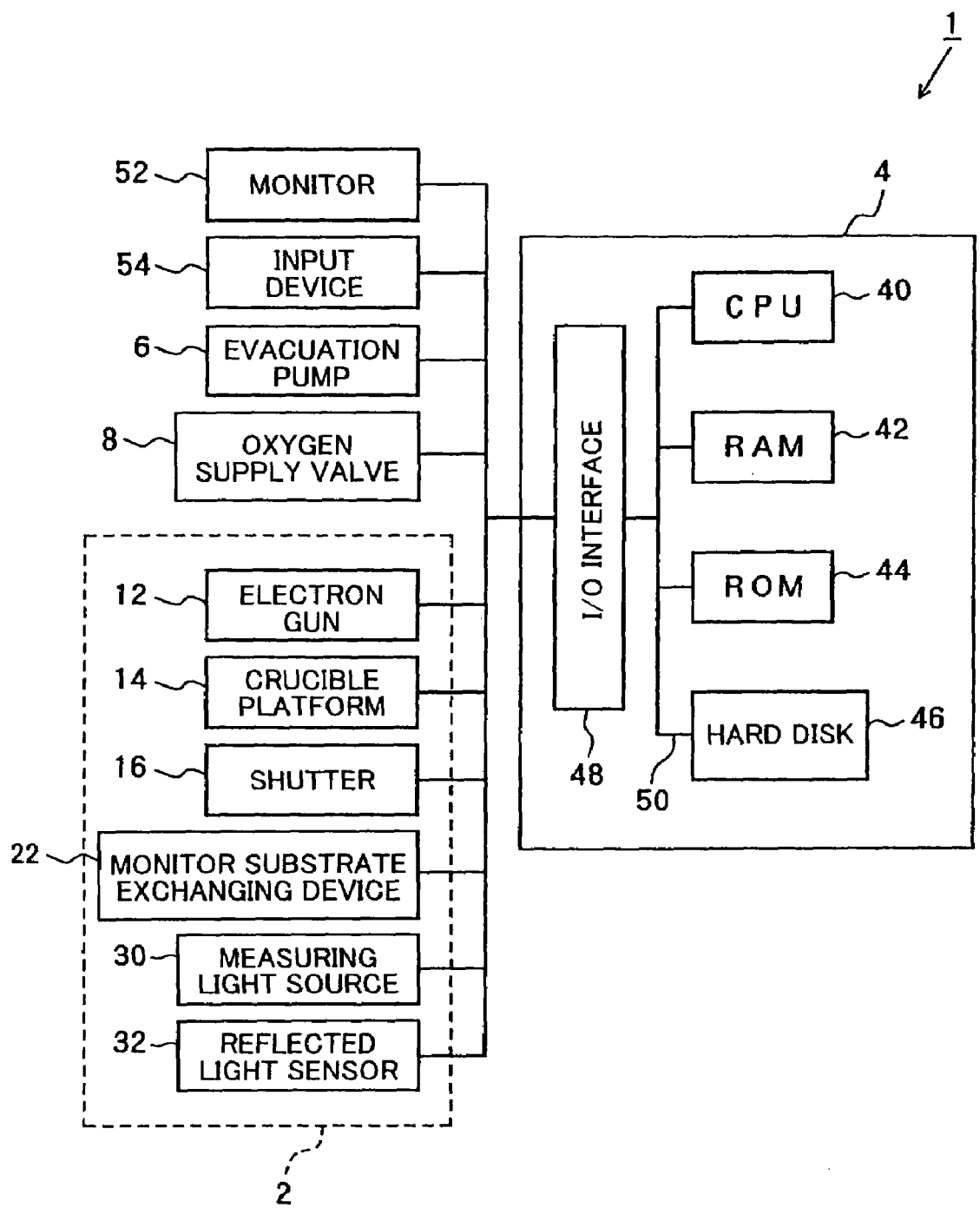
FIG. 10 is a block diagram showing a control device provided in the thin film forming apparatus of FIG. 3.

As shown in FIG. 10, the control device 4 is configured of a computer that includes a CPU 40, a RAM 42, a ROM 44, a hard disk 46, and an input/output interface 48 that are connected to one another via a bus 50. The CPU 40 executes programs stored in the ROM 44 and/or the hard disk 46 (a multilayer film forming program shown in FIG. 13, a thin film forming program shown in FIG. 16, and a test program shown in FIG. 17) to control operations of the vacuum deposition device 2 for forming thin films. The RAM 42 stores data required for controlling the thin film forming operation.

The control device 4 is connected to a display monitor 52 and an input device 54 such as a mouse or keyboard via the input/output interface 48. The control device 4 is also connected to the evacuation pump 6 and the oxygen supply valve 8, as well as to the electron gun 12, the crucible platform 14, the shutter 16, the monitor substrate exchanging device 22, the measuring light source 30, and the reflected light sensor 32 accommodated in the vacuum deposition device 2.

A user can input required data into the control device 4 by operating the input device 54 such as a mouse and/or keyboard, while viewing the display monitor 52.

By controlling the evacuation pump 6, the control device 4 evacuates the vacuum chamber 34 to reduce residual gas pressure. The control device 4 also controls the oxygen supply valve 8 to open and close for supplying oxygen from the oxygen tank 9 into the vacuum chamber 34 at a required timing.

The control device 4 controls the monitor substrate exchanging device 22 for loading a lot of monitor glass substrates M into the center through-hole 204 sequentially one at a time.

The control device 4 flows a current through the filament 120 of the electron gun 12 to initiate irradiation of the electron beam, and stops the electric current to halt irradiation from the electron beam. The control device 4 rotates the rotating shaft 140 of the crucible platform 14 until a desired crucible is positioned directly beneath the cutout portion 152, thereby vaporizing the desired deposition material. The control device 4 also controls the shutter 16 to open and close for selectively blocking the vaporized material from traveling out toward the substrate loading dome 20.

The control device 4 also drives the measuring light source 30 to irradiate the measuring light onto the monitor glass substrate M.

The control device 4 drives the reflected light sensor 32 for outputting an electric signal indicating the quantity of reflected light L received by the reflected light sensor 32, and receives this electric signal. The control device 4 normalizes the quantity of reflected light L indicated by the electric signals to control the timing for ending vapor deposition based on this normalized value (hereinafter referred to as a "normalized reflected light value I"). More specifically, an initial quantity of reflected light $L_0$ reflected off the monitor glass substrate M prior to forming a single thin film thereon is first normalized as a prescribed initial value $I_0$ (for example, 20 for $TiO_2$ and 90 for $SiO_2$) when the single thin film layer of a prescribed deposition material is formed. That is, a coefficient for normalization (normalizing coefficient) $p_0 = I_0/L_0$ is calculated. During the thin film forming process, the quantity of reflected light L indicated by electric signals from the reflected light sensor 32 is normalized using this normalizing coefficient $p_0$ to obtain the normalized reflected light value I ($p_0 \cdot L$).

When the vapor deposition is performed using a prescribed deposition material, the deposition material is deposited on both the monitor glass substrate M and the substrate K to form thin films thereon having the same thickness d. As the deposition process progresses, the optical thickness n·d (where n is the refractive index of the thin film and d is the thickness of the film) of the film being formed gradually increases. At this time, the reflectance R of the thin film satisfies the following Equation (1) for the optical thickness n·d of the thin film.

$$R = (r_1^2 + r_2^2 + 2r_1 r_2 \cos(4\pi nd/\lambda))/(1 + r_1^2 r_2^2 + 2r_1 r_2 \cos(4\pi nd/\lambda)) \tag{1}$$

Here, $r_1$ is an amplitude reflectance (Fresnel coefficient) at the interface between the thin film and the monitor glass substrate M, and is expressed by $(n-n_g)/(n+n_g)$, where $n_g$ is the refractive index of the monitor glass substrate M. Further, $r_2$ is the amplitude reflectance at the interface between the thin film and the vacuum, and is expressed by $(n_0-n)/(n_0+n)$, where $n_0$ is the refractive index in the vacuum, which is 1.

The normalized reflected light value I is expressed by the following Equation (2).

$$I = P_0 \cdot R$$
$$= P_0 \cdot (r_1^2 + r_2^2 + 2r_1r_2\cos(4\pi nd/\lambda))/(1 + r_1^2r_2^2 + 2r_1r_2\cos(4\pi nd/\lambda)) \quad (2)$$

Here, $P_0$ is a constant that satisfies the following Equation (3).

$$P_0 = I_0/[(n_0 - n_g)/(n_0 + n_g)]^2 \quad (3)$$

$P_0$ satisfies Equation (3) because the quantity of light reflected off the monitor glass substrate M is normalized to a prescribed initial value $I_0$, and the reflectance of the monitor glass substrate M is equivalent to the reflectance R, which is $[(n_0 - n_g)/(n_0 + n_g)]^2$, when d=0 in Equation (1).

Figure 11A:
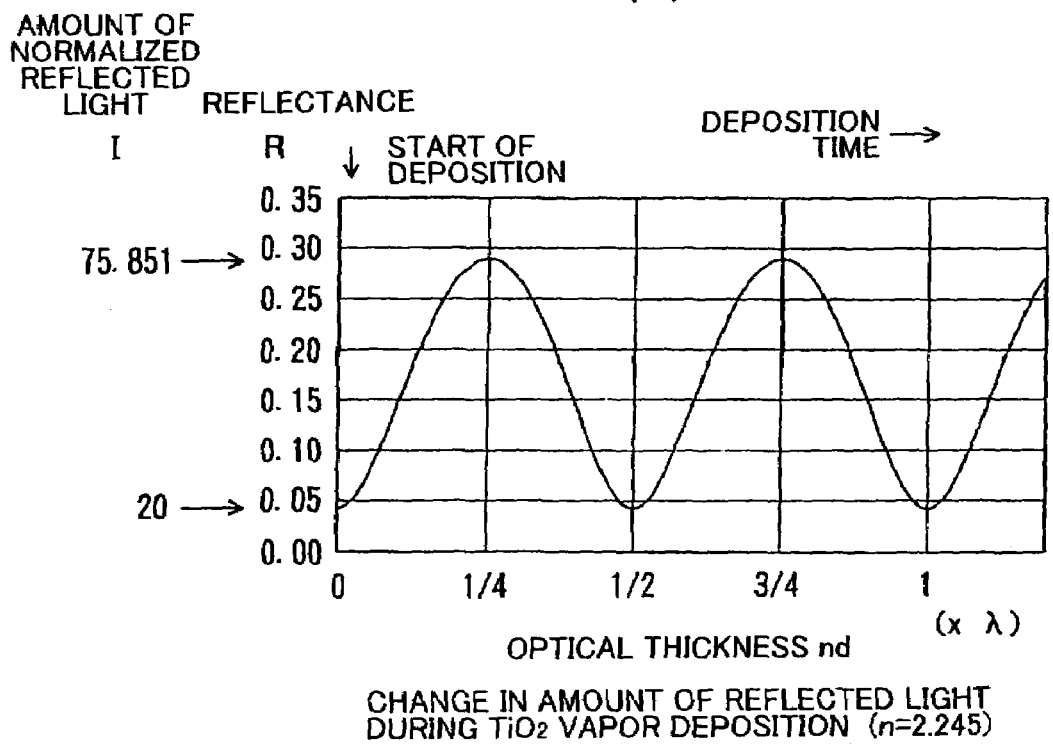
FIG. 11(a) is a graph showing changes in reflectance and an amount of reflected light as deposition of a single $TiO_2$ layer progresses.
Figure 11B:
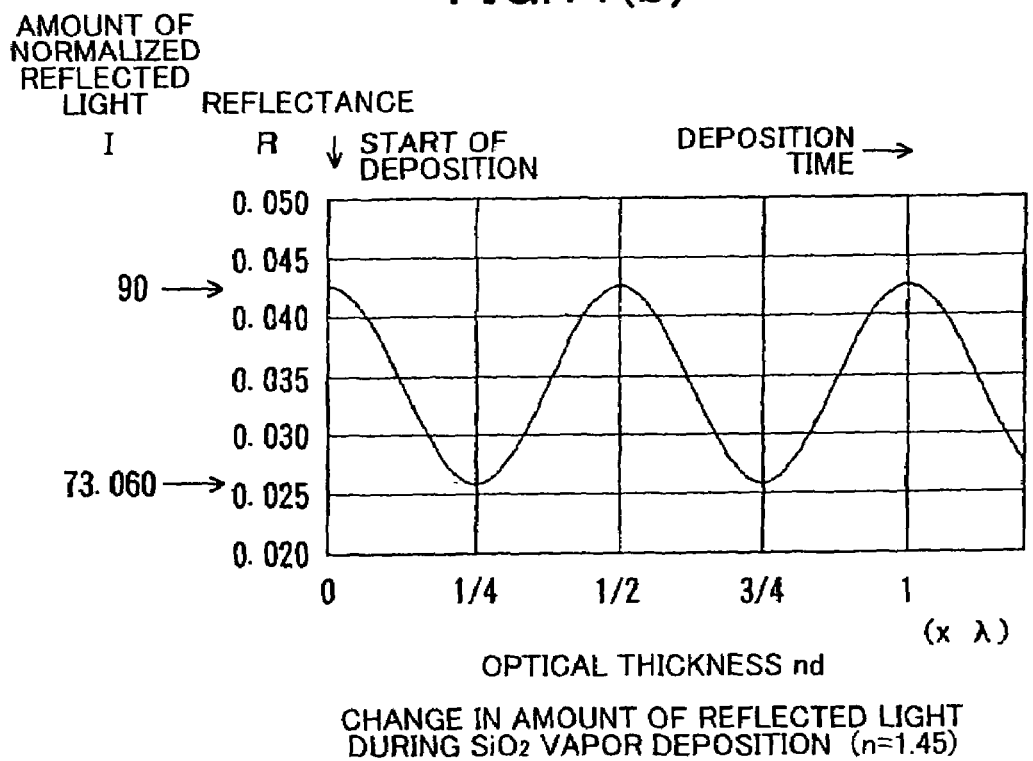
FIG. 11(b) is a graph showing changes in reflectance and an amount of reflected light as deposition of a single $SiO_2$ layer progresses.

Accordingly, the tracks of the reflectance R and the normalized reflected light value I show a simple harmonic motion that peaks every time the optical thickness n·d of the thin film reaches a multiple of one-fourth the wavelength λ of the measuring light, as shown in FIGS. 11(a) and 11(b). In a thin film such as $TiO_2$, in which the refractive index n is larger than the refractive index $n_g$ (about 1.52) of the monitor glass substrate M, the reflectance R and the normalized reflected light value I exhibit a maximum peak when the optical thickness n·d reaches one-fourth the wavelength λ of the measuring light, as shown in FIG. 11(a). Subsequently, the reflectance R and normalized reflected light value I exhibit peaks (maximum and minimum peaks) each time the optical thickness n·d reaches a multiple of one-fourth the wavelength λ of the measuring light. In thin films such as $SiO_2$ in which the refractive index n is smaller than the refractive index $n_g$, the reflectance R and the normalized reflected light value I exhibit a minimum peak when the optical thickness n·d reaches one-fourth the wavelength λ of the measuring light, as shown in FIG. 11(b). Subsequently, the reflectance R and the normalized reflected light value I exhibit peaks (maximum or minimum peaks) each time the optical thickness n·d reaches a multiple of one-fourth the wavelength λ of the measuring light.

The measuring light has a wavelength λ of 555 nm, for example, and when attempting to form a $TiO_2$ thin film with an optical thickness n·d of 555/4 nm (about 139 nm), it is clear that film formation can be ended after the normalized reflected light value I curve increases from its initial value of 20 and reaches its first peak (maximum peak). Further, when forming an $SiO_2$ thin film having an optical thickness n·d of 555/4 nm (about 139 nm), it is clear that the film formation should be ended after the normalized reflected light value I curve decreases from its initial value of 90 and reaches the first peak (minimum peak).

When a thin film having a refractive index n at an arbitrary optical thickness A (A=n·d, where λ/4≦n·d≦λ/2) is formed, generally vapor deposition must be continued until the normalized reflected light value I reaches a target light quantity D shown in following Equation (4) after reaching its first peak. And then the vapor deposition is stopped when the normalized reflected light value I reaches the target light quantity D.

$$D = P_0 \cdot (r_1^2 + r_2^2 + 2r_1r_2\cos(4\pi A/\lambda))/(1 + r_1^2r_2^2 + 2r_1r_2\cos(4\pi A/\lambda)) \quad (4)$$

The thin film of the desired optical thickness A can be formed by stopping vapor deposition at the point in time that the normalized reflected light value I reaches the target light quantity D after reaching its first peak (maximum or minimum peak).

Further, with the thin film forming apparatus 1 of the preferred embodiment, a multilayer film having alternating layers of $TiO_2$ and $SiO_2$, each having an arbitrary optical thickness can be formed by alternately depositing two different kinds of deposition materials (such as $TiO_2$ and $SiO_2$ in this embodiment) on the substrate K sequentially.

Next, the operation will be described for a method of forming a multilayer mirror including a lot of alternating layers of $TiO_2$ having a desired optical thickness $A_t$ (such as 150 nm) and $SiO_2$ having a desired optical thickness $A_s$ (such as 150 nm).

In this case, a vapor deposition operation for depositing $TiO_2$ and another vapor deposition operation for depositing $SiO_2$ are alternately performed several times. Specifically, vapor deposition of $TiO_2$ is performed in odd-numbered vapor deposition operations, such as the $1^{st}$ time and $3^{rd}$ time. At this time, the crucible U1 is positioned directly beneath the cutout portion 152 for the $TiO_2$ vapor deposition. Another vapor deposition with $SiO_2$ is performed in even-numbered operations, such as the $2^{nd}$ time and $4^{th}$ time. Hence, the crucible U2 is positioned directly beneath the cutout portion 152 for the $SiO_2$ vapor deposition. Further, in each vapor deposition operation (hereinafter referred to as the $i^{th}$ vapor deposition operation, such that 1≦i≦N, where N is the total number of layers being formed), a target light quantity D(i; such that 1≦i≦N) is preset as a target for ending the vapor deposition operation.

Next, the target light quantity D(i) will be described.

Here, it is assumed that a refractive index n(i; such that i=1, 3, . . . ) of layers formed by the material $TiO_2$ (layers formed in odd-numbered vapor deposition operations) are all equivalent to a value $n_t$. This case will consider when it is desirable to form all $TiO_2$ layers at the same optical thickness $A_t$. In this case, all target light quantity D(1), D(3), . . . used in the corresponding vapor deposition operations should be set to the same value $D_t$ determined by the following Equation (5).

$$D_t = P_{0t} \cdot (r_1^2 + r_2^2 + 2r_1r_2\cos(4\pi A_t/\lambda))/(1 + r_1^2r_2^2 + 2r_1r_2\cos(4\pi A_t/\lambda)) \quad (5)$$

wherein $r_1 = (n_t - n_g)/(n_t + n_g)$, $r_2 = (n_0 - n_t)/(n_0 + n_t)$, and $P_{0t} = 20/[(n_0 - n_g)/(n_0 + n_g)]^2$.

Further, it is assumed that the refractive index n(i: i=2, 4, . . . ) for layers formed by the material $SiO_2$ (layers formed in even-numbered vapor deposition operations) are all equivalent to a value $n_s$. This case will consider when all $SiO_2$ layers at the same optical thickness $A_s$ are formed, all target light quantity D(2), D(4), . . . used in the corresponding vapor deposition operations are set to the same value $D_s$ determined by the following Equation (6).

$$D_s = P_{0s} \cdot (r_1^2 + r_2^2 + 2r_1r_2\cos(4\pi A_s/\lambda))/(1 + r_1^2r_2^2 + 2r_1r_2\cos(4\pi A_s/\lambda)) \quad (6)$$

wherein $r_1 = (n_s - n_g)/(n_s + n_g)$, $r_2 = (n_0 - n_s)/(n_0 + n_s)$, and $P_{0s} = 90/[(n_0 - n_g)/(n_0 + n_g)]^2$.

For example, it is assumed that the refractive index $n_t$ of the $TiO_2$ layers is a fixed value of 2.245, while the refractive index $n_s$ for $SiO_2$ layers is a fixed value of 1.45. In this example, as shown in the table of FIG. 12, the normalized reflected light value I during the formation of any layer of $TiO_2$ film increases from the initial value of 20 until reaching a prescribed maximum peak of 75.851. After reaching the peak, the normalized reflected light value I begins to decrease. The optical thickness $A_t$ then becomes 150 nm when the normalized reflected light value I reaches 75.171 (FIG. 11(a)). Similarly when any $SiO_2$ thin film is formed, the normalized reflected light value I decreases from the initial value 90 until reaching a minimum peak 73.060. After reaching the peak, the normalized reflected light value. I begins to increase. The optical thickness $A_s$ then reaches 150 nm when the normalized reflected light value I reaches 73.338 (FIG. 11(b)). Hence, if it is desirable to form a multilayer film with all layers 1-20 having an optical thickness $A_t=A_s=150$ nm, for example, the target light quantities D(1), D(3), ..., D(19) are set to 75.171, while the target light quantities D(2), D(4), ... D(20) are set to 73.338, as shown in FIG. 12. These target light quantities D(1)-D(20) are stored in the RAM 42.

Generally, if it is desirable to form a multilayer film having a total of N layers, with each layer formed of a material having a refractive index n(i) and each layer having a desired optical thickness A(i), a target light quantity D(i) capable of satisfying the following Equation (7) is set for each layer i ($1 \leq i \leq N$) and stored in the RAM 42.

$$D(i)=P_0(i)\cdot(r_1^2+r_2^2+2r_1r_2\cos(4\pi A(i)/\lambda))/(1+r_1^2r_2^2+2r_1r_2\cos(4\pi A(i)/\lambda)) \quad (7)$$

wherein $r_1=(n(i)-n_g)/(n(i)+n_g)$, $r_2=(n_0-n(i))/(n_0+n(i))$ and $P_0(i)=I_0(i)/[(n_0-n_g)/(n_0+n_g)]^2$.

Here, $I_0(i)$ is a prescribed initial value for the normalized reflected light value I(i), such as 20 for $TiO_2$ thin films and 90 for $SiO_2$ thin films.

The control device 4 forms such a multilayer film having N total layers by consecutively repeating the vapor deposition operation a total of N times based on these target light quantities D(i) (D(1)-D(N)).

Next, a multilayer film forming process will be described with reference to FIG. 13, wherein vapor deposition operations are consecutively performed a total of N times, while alternating between the two deposition materials $TiO_2$ and $SiO_2$. In this embodiment, the deposition operation for forming a thin film of the $i^{th}$ layer ($1 \leq i \leq N$) in the multilayer film forming process is referred to as the $i^{th}$ vapor deposition operation.

In order to perform this multilayer film forming process, the CPU 40 in the control device 4 executes the multilayer film forming program stored on either the ROM 44 or the hard disk 46.

In the multilayer film forming process, first the user fixes a substrate K to be subjected to vapor deposition into the substrate holding through-holes 206 of the substrate loading dome 20. When a sensor not shown in the drawings detects that the user has closed the vacuum chamber 34, then the CPU 40 performs a preparatory operation of the multilayer film forming process in S10. That is, the CPU 40 drives the evacuation pump 6 to begin evacuating the vacuum chamber 34. The CPU 40 also turns on the measuring light source 30 to activate the reflected light sensor 32. In the initial state, both the shutter 16 and the oxygen supply valve 8 are closed.

Next, the CPU 40 sets the variable i to an initial value: 1 in S20. In S30, the CPU 40 initiates the $i^{th}$ (here i=1) vapor deposition operation.

Specifically, when i is an odd number, the CPU 40 opens the oxygen supply valve 8 and supplies a constant flow of oxygen into the vacuum chamber 34. On the contrary, if the normalized reflected light value I is an even number, the oxygen supply valve 8 remains closed.

The CPU 40 also controls the monitor substrate exchanging device 22 to replace the monitor glass substrate M fixed in the center through-hole 204 and used in the previous (i-1)$^{th}$ vapor deposition operation with a new monitor glass substrate M that has not undergone vapor deposition. As a result, a measuring light of a prescribed wavelength λ (in this case, 555 nm) is irradiated on the new monitor glass substrate M. The reflected light sensor 32 outputs electric signals indicating the initial quantity of reflected light $L_0(i)$ reflected off the monitor glass substrate M. The CPU 40 calculates a normalizing coefficient $p_0(i)$ required for normalizing the initial quantity of reflected light $L_0(i)$ based on the received electric signals to a prescribed initial value $I_0(i)$ (where $I_0(i)$=20 when i is odd and 90 when i is even; in other words, $p_0(i)=I_0(i)/L_0(i)$). The CPU 40 stores the calculated normalizing coefficient $p_0(i)$ in the RAM 42.

The CPU 40 also controls the crucible platform 14 to position the crucible containing the corresponding deposition material ($TiO_2$ when i is odd and $SiO_2$ when i is even) directly beneath the cutout portion 152. The CPU 40 also begins driving the electron gun 12 to vaporize the deposition material by using an electron beam therefrom. Subsequently, the CPU 40 opens the shutter 16 to begin depositing vaporized deposition material on both the substrate K and the monitor glass substrate M.

After beginning to deposit the deposition material, the CPU 40 sets a Flag F in the RAM 42 to an initial value of 0 (S40). In S50 the CPU 40 receives an electric signal from the reflected light sensor 32, normalizes the quantity of reflected light L(i) indicated by the signal using the normalizing coefficient $p_0(i)$ to calculate the normalized reflected light value I(i) (that is, $p_0(i)\cdot L(i)$).

In S60 the CPU 40 determines whether the value of the Flag F is 1. If the Flag F is 0 (S60: NO), then in S70 the CPU 40 determines whether the normalized reflected light value I(i) has reached a peak. If i is an odd number in this case, then the CPU 40 determines whether the normalized reflected light value I(i) has begun increasing from the initial value $I_0(i)$ and then decreasing, that is, has reached a maximum value. However, if i is an even number, then the CPU 40 determines whether the normalized reflected light value I(i) has begun decreasing from the initial value $I_0(i)$ and then increasing, that is, has reached a minimum value.

Until the normalized reflected light value I(i) has reached the peak (S70: NO), the CPU 40 repeats the processes of S50, S60 (NO), and S70 to calculate and monitor the normalized reflected light value I(i).

When the normalized reflected light value I(i) has reached a peak (S70: YES), in S80 the CPU 40 sets the Flag F to 1 and advances to S90.

In S90 the CPU 40 determines whether the normalized reflected light value I(i) has reached the target light quantity D(i) stored in the RAM 42. Until the normalized reflected light value I(i) has reached the target light quantity D(i) (S90: NO), the processes of S50, S60 (YES), and S90 are repeatedly performed to calculate and monitor the normalized reflected light value I(i).

When the normalized reflected light value I(i) reaches the target light quantity D(i) (S90: YES), then in S100 the CPU 40 ends the $i^{th}$ vapor deposition operation. In other words, the CPU 40 closes the shutter 16 and simultaneously stops driving the electron gun 12. If i is an odd number, the CPU 40 closes the oxygen supply valve 8 and stops supplying oxygen.

In this way, the quantity of reflected light L(i) indicated by electric signals from the reflected light sensor 32 is normalized, and the value I(i) ($=L(i)\cdot p_0(i)$) is continuously monitored during the $i^{th}$ vapor deposition operation. Vapor deposition is ended when the normalized reflected light value I(i) reaches the value target light quantity D(i) after reaching its first peak (a maximum peak during odd-numbered vapor deposition operations and a minimum peak during even-numbered vapor deposition operations).

As a result of performing this $i^{th}$ vapor deposition operation, a thin film having an optical thickness A(i) that satisfies Equation (7) is formed on both the substrate K and the monitor glass substrate M.

In S110 the CPU 40 determines whether the variable i has reached the total layer number N. If the variable i has not reached the total layer number N (S110: NO), then in S130 the CPU 40 increments the variable i by one and returns to S30 to perform the next vapor deposition operation.

Prior to beginning each ($i^{th}$) vapor deposition operation, the CPU 40 exchanges the monitor glass substrate M for a new monitor glass substrate M that has not undergone vapor deposition. Therefore, in each vapor deposition operation, only a single thin film, which is formed during the current vapor deposition operation, is formed on the monitor glass substrate M. On the other hand, vapor deposition operations are repeated to the substrate K, superimposing a thin film formed in each current vapor deposition operation over the thin film formed in the previous operation.

Further, when each ($i^{th}$) vapor deposition operation is performed, the normalizing coefficient $p_0(i)$ for normalizing the quantity of reflected light is first calculated based on the initial quantity of reflected light $L_0(i)$ reflected off the monitor glass substrate M. In S50 the quantity of reflected light $L(i)$ obtained for the current vapor deposition operation is normalized using the normalizing coefficient $p_0(i)$ to calculate the normalized reflected light value $I(i)$ (=$p_0(i) \cdot L(i)$). Accordingly, the normalized reflected light value $I(i)$ can be calculated with consideration for changes in the amount of light irradiated from the measuring light source 30 in each vapor deposition operation.

After completing all N vapor deposition operations (S110: YES), in S140 the CPU 40 halts the evacuation operation of the evacuation pump 6, turns off the measuring light source 30, and halts operations of the reflected light sensor 32.

The multilayer film forming process ends after the formation of all N layers of the film is completed.

Here, the inventors of the present invention performed actual experiments to form alternating layers of $TiO_2$ and $SiO_2$ from a $1^{st}$ layer to a $23^{rd}$ layer (thus, N=23). During the vapor deposition operation of each layer, changes in the normalized reflected light value $I(i)$ were monitored. And the value $I(i)$ when the normalized reflected light value $I(i)$ first reaches a peak was recorded. Specifically, the normalized reflected light value $I(i)$ when the optical thickness reaches $\lambda/4$ is a maximum peak value for $TiO_2$ and a minimum peak value for $SiO_2$ (hereinafter referred to as a peak quantity of reflected light Im(i). When the $1^{st}$ layer, $3^{rd}$ layer, . . . , and $23^{rd}$ layer formed of the material $TiO_2$ are monitored, it was discovered that the obtained peak quantity of reflected light Im(1), Im(3), . . . , and Im(23) changed from operation to operation. The $2^{nd}$ layer, $4^{th}$ layer, . . . , and $22^{nd}$ layer formed of $SiO_2$ also changed.

Here, the reflectance Rm(i) of the thin film when the optical thickness reaches $\lambda/4$ (hereinafter referred to as the peak reflectance) and the refractive index $n(i)$ of the thin film have a relationship shown in the following Equation (8).

$$n(i) = n_g^{1/2} \cdot [\{1 + Rm(i)^{1/2}\}/\{1 - Rm(i)^{1/2}\}]^{1/2} \quad (8)$$

Further, the peak reflectance Rm(i) is related to the peak quantity of reflected light Im(i), as shown in Equation (9) below.

$$Rm(i) = Im(i)/P_0(i) \quad (9)$$
$$= Im(i) \cdot [(n_0 - n_g)/(n_0 + n_g)]^2 / I_0(i)$$

Therefore, the inventors calculated the refractive index $n(i)$ for each layer by calculating Equations (8) and (9) based on the peak quantity of reflected light Im(i) actually obtained for each of the $1^{st}$-$23^{rd}$ layers.

Figure 14:
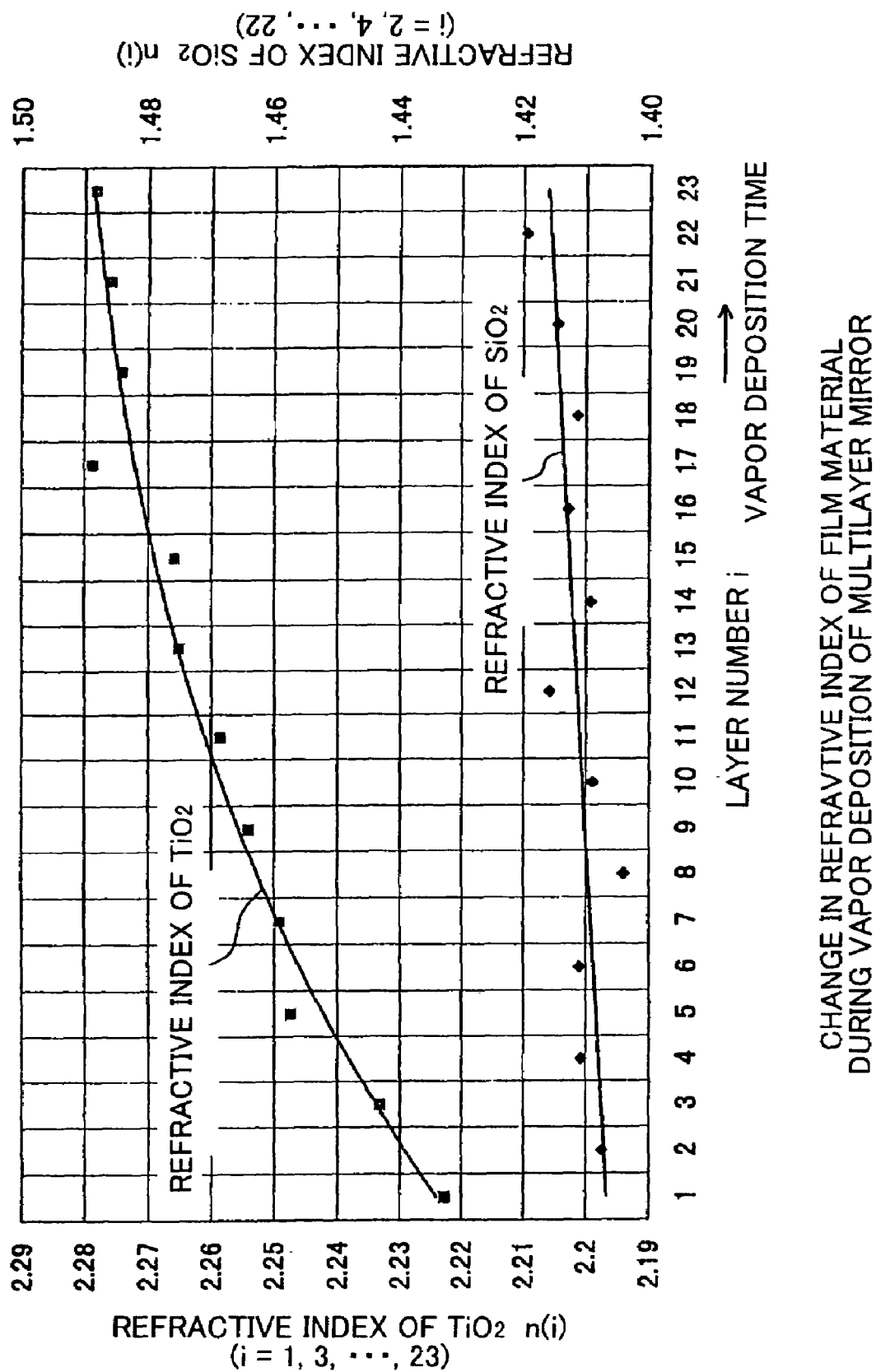
FIG. 14 is a graph showing gradual changes in the refractive index for each layer when forming 23 layers while alternating between $TiO_2$ and $SiO_2$.

FIG. 14 shows a graph of the refractive index $n(i)$ (here, n=1-23 in this case) found for the $1^{st}$-$23^{rd}$ layers. The horizontal axis represents the progression of formed layers in the sequence of $1^{st}$ layer ($TiO_2$), $2^{nd}$ layer. ($SiO_2$), . . . , $22^{nd}$ layer ($SiO_2$), and $23^{rd}$ layer ($TiO_2$) with the left edge serving as the substrate side.

From this graph, it is clear that the values of refractive index rise gradually as the vapor deposition operation is repeated, even for layers formed of the same material. It can be seen that the refractive index for $TiO_2$ in particular rises remarkably.

These changes can be attributed to the following reasons.

The vapor deposition operations are performed after beginning evacuation of the vacuum chamber 34 using the evacuation pump 6, and are repeated the $1^{st}$-$N_{th}$ times while continuing this evacuation. Accordingly, the degree of vacuum is thought to improve gradually while continuing evacuation. As the degree of vacuum increases, the vaporized particles have less tendency to collide with residual gas molecules and are therefore less likely to lose energy. Hence, these vaporized particles are thought to condense on the substrates at a high filling factor, which increases the refractive index. For this reason, it is thought that the refractive index gradually increases as the vapor deposition process progresses.

During the process for forming $TiO_2$ films in particular, the vacuum chamber 34 is evacuated while being supplied with oxygen. As a result, the degree of vacuum is considerably low at the beginning of the series of deposition operations, considerably reducing the density of the deposition layers and thereby lowering the refractive index. However, as the vapor deposition operations are repeated and the evacuation process progresses, the refractive index is thought to increase considerably.

Figure 15:
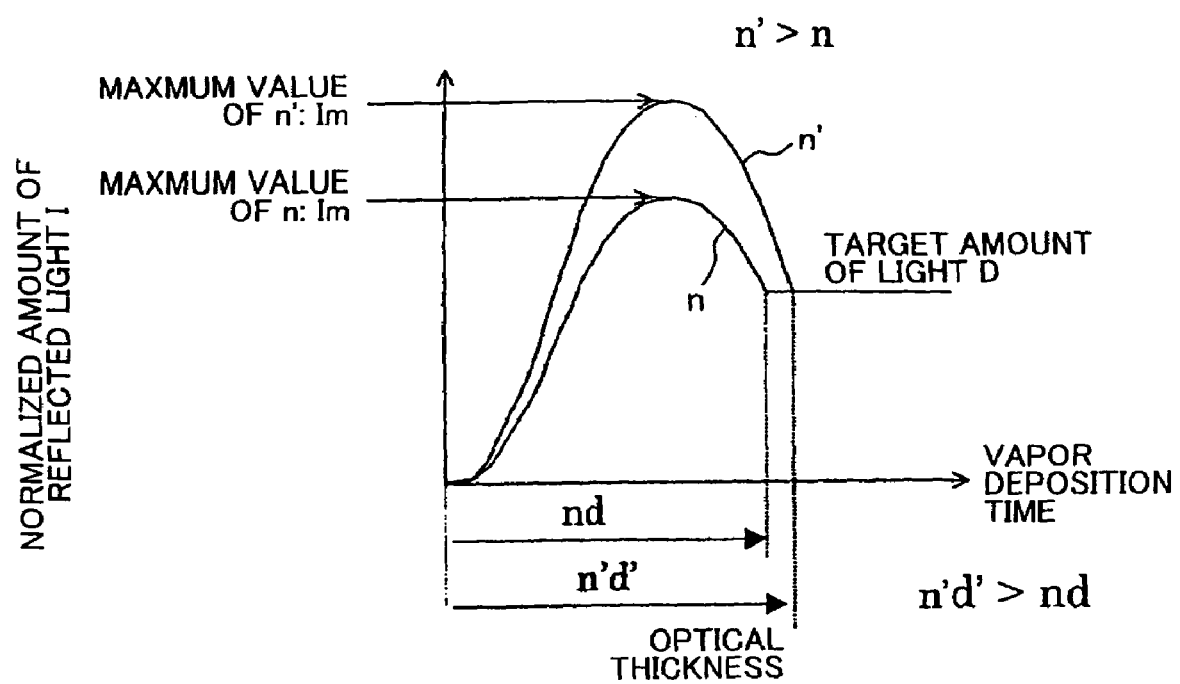
FIG. 15 is a graph showing the relationship between an actual optical thickness n'·d' and a desired optical thickness n·d when the target light quantity D for forming the desired optical thickness n·d is determined based on the estimated refractive index n and vapor deposition is continued until the normalized reflected light value I reaches the target light quantity D, despite the actual refractive index n' being greater than the estimated refractive index n.

When the refractive index of each layer is changing between the layers by repeating the vapor deposition operation, the reflectance also changes. For example, the amplitude of reflectance increases when the refractive index increases. It is assumed that an actual refractive index n' of a certain layer being formed deviates from an estimated refractive index n. Further, it is assumed the target light quantity D is provided based on the estimated refractive index n for forming this layer to achieve a desired optical thickness A=n·d. In this case, since the actual refractive index n' deviates from the estimated value refractive index n, a film having the desired optical thickness A=n·d cannot be obtained when the vapor deposition is controlled based on just the target light quantity D. When the actual refractive index n' is greater than the refractive index n, for example, as shown in FIG. 15, and vapor deposition is continued until the normalized reflected light value I reaches the target light quantity D, the n'·d' of the thin film actually formed is greater than the desired optical thickness A=n·d.

Figure 13:
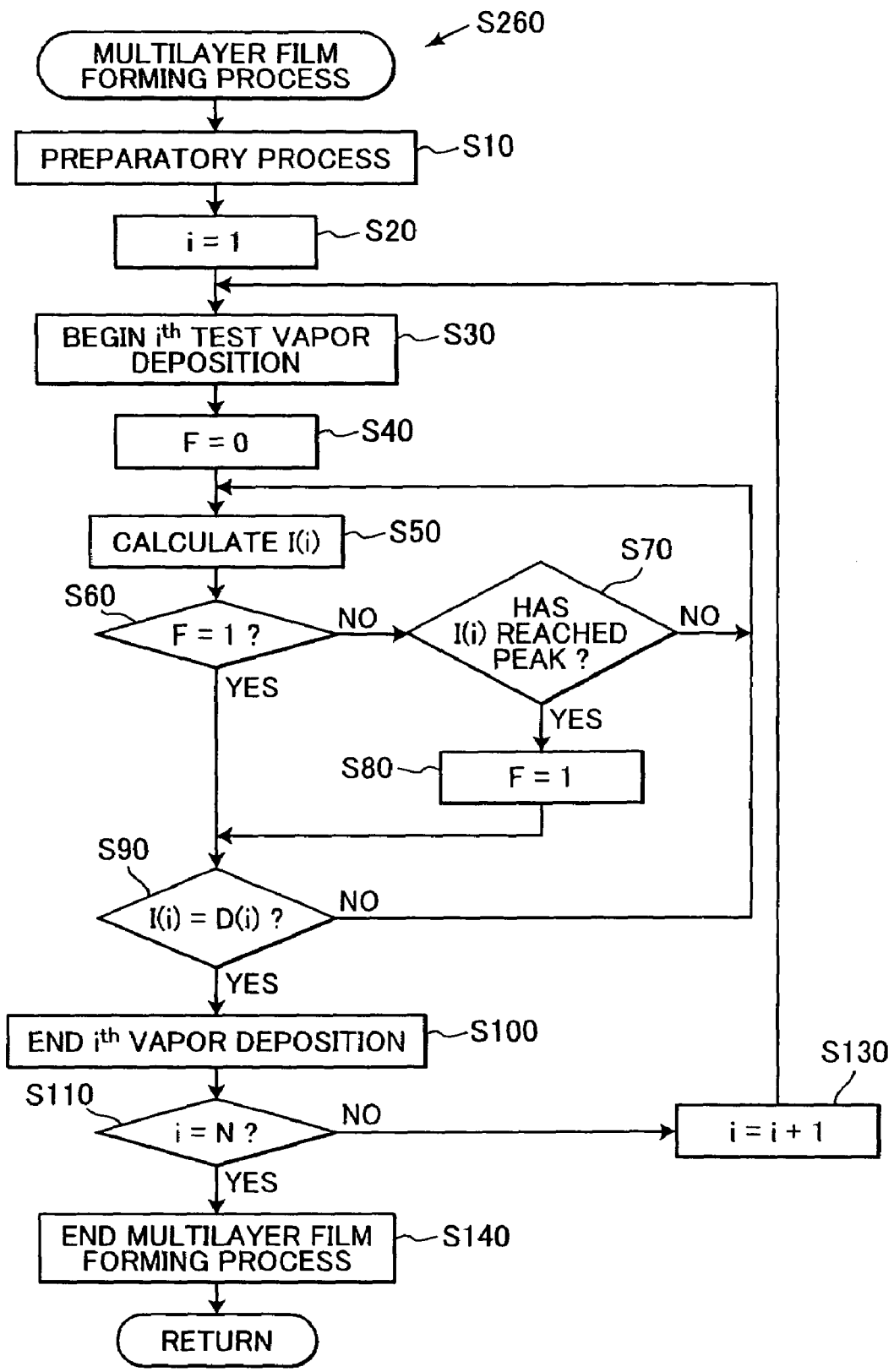
FIG. 13 is a flowchart showing steps in a multilayer film forming process according to the first embodiment.

In this embodiment, the control device 4 measures the refractive index $n(i)$ individually for each layer by executing a test process prior to beginning the multilayer film forming process of FIG. 13 to create a graph plotting variations in refractive index, such as that shown in FIG. 14. Then the control device 4 calculates the target light quantity $D(i)$ to be used for forming each layer, based on this refractive index $n(i)$. It is assumed that the refractive indexes shown in FIG. 14 are measured for each layer through the test process. In other words, the refractive index of each layer is measured through computations as values plotted in FIG. 14. For example, the refractive index of $TiO_2$ in the $1^{st}$ layer is 2.223, and the refractive index of the $11^{th}$ layer is 2.259. Using Equation (7), therefore, the target light quantity D(l) for $TiO_2$ of the $1^{st}$ layer is calculated based on the refractive index n(1)=2.223, while the target light quantity D(11) for the $11^{th}$ layer is calculated based on the refractive index n(11)=2.259.

Here, the test process is performed approximately in the same manner as the multilayer film forming process described earlier. That is, evacuation by the evacuation pump 6 is initiated. At the same time, a test vapor deposition operation substantially identical to the vapor deposition operation of the multilayer film forming process is repeatedly performed while continuing evacuation. Specifically, a test vapor deposition operation is repeatedly executed the same number of times (the total layer number N) and in the same sequence as the vapor deposition operations in the multilayer film forming process to deposit the same materials that will be deposited in the multilayer film forming process. The test process is performed over approximately the same time as required for the multilayer film forming process. Accordingly, the effects of evacuation in each test vapor deposition operation is thought to be substantially similar to the effects in the corresponding vapor deposition operations of the multilayer film forming process.

However, in the test vapor deposition operations, only the monitor glass substrate M is mounted in the substrate loading dome 20 and the substrate K is not mounted. Further, each test vapor deposition operation is controlled to end at the time the normalized reflected light value I first reaches a peak (a maximum or minimum peak).

Next, the entire steps in the thin film forming operation of the thin film forming apparatus 1 according to the preferred embodiment will be described with reference to FIGS. 16 and 17.

This thin film forming operation is performed when the CPU 40 of the control device 4 executes the thin film forming program, the test program, and the multilayer film forming program stored on the ROM 44 or the hard disk 46.

First, the user determines the material with a high refractive index and the material with a low refractive index for forming the multilayer film and the total number of layers in the multilayer film based on the desired optical characteristics of the film to be formed. Using the input device 54, the user inputs into the control device 4 approximate values for the refractive indexes nH of the material with a high refractive index and nL of the material with a low refractive index determined above, the total number of layers N, and an approximate value a(i) ($1 \leq i \leq N$) for the optical thickness of each layer. The CPU 40 calculates the optical thickness A(i) ($1 \leq i \leq N$) for each layer in the multilayer film having desired optical characteristics based on the inputted data.

Next, a preferred embodiment will be described for a case in which the user tries to form a multilayer mirror having desired reflecting characteristics and formed of a total layer number N of 20, including a material $TiO_2$ having a higher refractive index and a material $SiO_2$ having a lower refractive index.

In this case, the user first operates the input device 54 to input an approximate value of 2.245 for the higher refractive index nH of the material $TiO_2$, an approximate value of 1.45 for the lower refractive index nL of the material $SiO_2$, and a value 20 for the total layer number N. Additionally, the user inputs into the control device 4 a value of 150 nm as the approximate optical thickness a(i) ($1 \leq i \leq 20$) for each layer.

After receiving the above data, the CPU 40 first executes in S210 a calculation based on the input values nH, nL, N, and a(i) to obtain the optical thickness A(i) ($1 \leq i \leq 20$) desirable for each layer. Specifically, the CPU 40 sets the inputted value a(i) as an initial value for the optical thickness A(i) for each layer, and then performs a simulation computation of optical characteristics for the multilayer film to be formed based on the input values nH, nL, and N. If the calculated optical characteristics do not match the desired characteristics, then the value for the optical thickness A(i) is changed and the calculation of optical characteristics is repeated. This computation is repeated while varying the value of the optical thickness A(i) step by step until the desired optical characteristics are obtained. Once the desired characteristics are obtained, the CPU 40 sets the optical thickness A(i) for each layer used in the calculations as the optical thickness A(i) for each layer to be formed in the actual process. The CPU 40 stores the values for the optical thickness A(i) set for all layers i ($1 \leq i \leq N$, where N=20) in the RAM 42.

It is assumed that an initial value a(i) (150 nm) is used as the optical thickness A(i), so that the calculated optical characteristics becomes identical to the desired optical characteristics. Accordingly, the CPU 40 sets the optical thickness A(i) ($1 \leq i \leq 20$) for all layers to 150 nm.

Next, in S220 the CPU 40 performs a test process by controlling the vacuum deposition device 2. That is, the CPU 40 continuously performs test vapor deposition operations while alternating between deposition materials $TiO_2$ and $SiO_2$ from the $1^{st}$ operation to the $N^{th}$ (here, N=20) operation. More specifically, the material $TiO_2$ is used in all odd-numbered vapor deposition operations and $SiO_2$ is used in all even-numbered vapor deposition operations.

Figure 17:
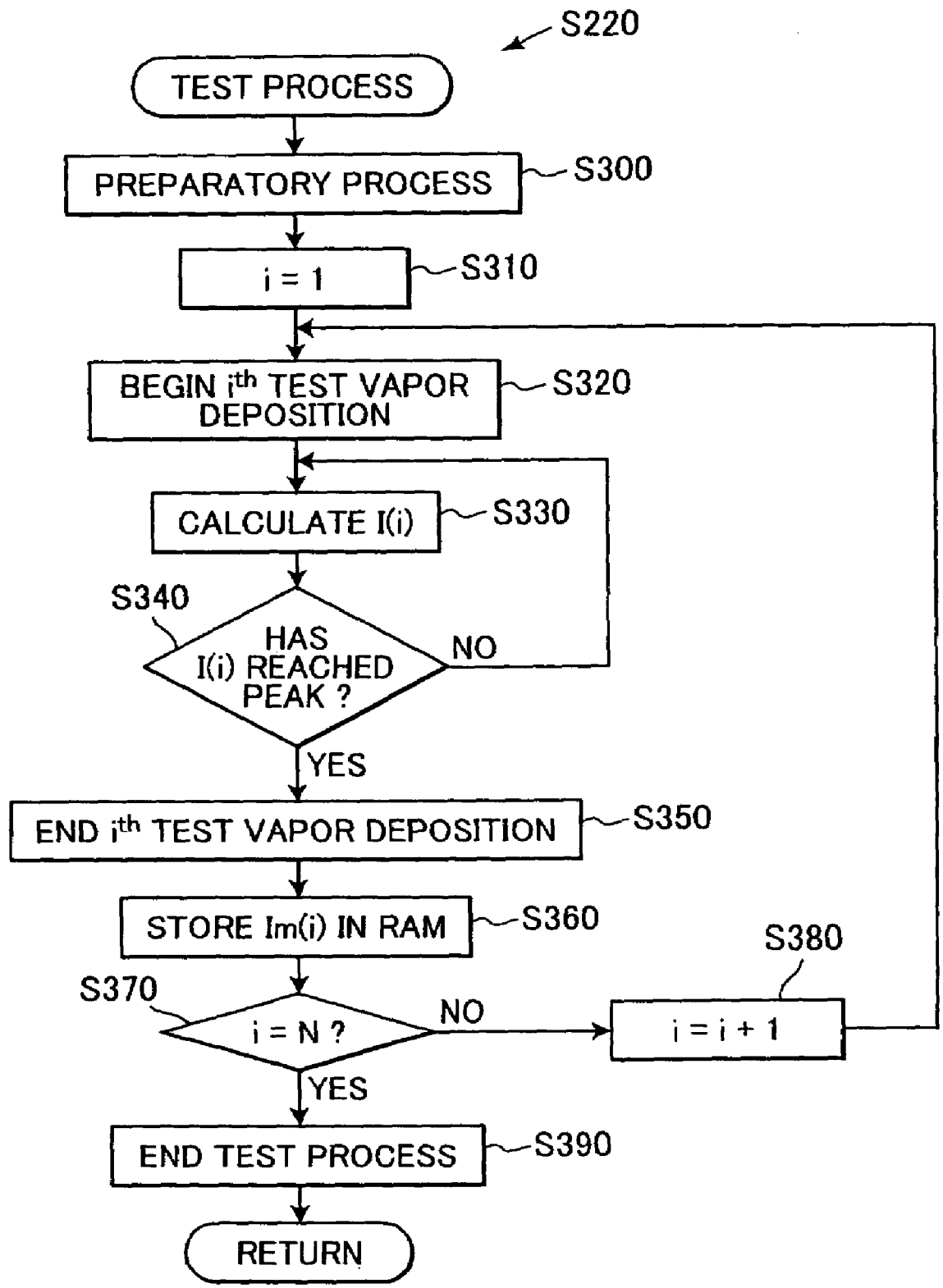
FIG. 17 is a flowchart showing steps in a test process performed in the thin film forming process of FIG. 16.

Specifically, in the test process of S220, the CPU 40 performs a preliminary operation of the test process in S300 of FIG. 17. That is, the CPU 40 drives the evacuation pump 6 to begin evacuation. The CPU 40 also begins driving the measuring light source 30 and the reflected light sensor 32.

Next, the CPU 40 sets the variable i to the initial value of 1 in S310.

In S320 the CPU 40 begins the $i^{th}$ (where i=1) test vapor deposition operation.

Hence, when i is an odd number, the oxygen supply valve 8 is opened so that oxygen is introduced therethrough. On the contrary, when i is an even number, the oxygen supply valve 8 is left closed. The monitor substrate exchanging device 22 is driven to exchange the monitor glass substrate M currently mounted in the substrate loading dome 20 with a new monitor glass substrate M. The CPU 40 then calculates a normalizing coefficient $p_0(i)$ (=$I_0(i)/L_0(i)$) for normalizing the initial quantity of reflected light $L_0(i)$ reflected off the new monitor glass substrate M to a prescribed initial value $I_0(i)$ (20 when i is an odd number and 90 when i is an even number). Next, the CPU 40 drives the crucible platform 14, drives the electron gun 12, opens the shutter 16, and begins vapor deposition of the corresponding material ($TiO_2$ when i is odd and $SiO_2$ when i is even).

In S330 the quantity of reflected light L(i) reflected from the thin film formed on the monitor glass substrate M is normalized by the normalizing coefficient $p_0(i)$ to obtain the normalized reflected light value I(i) (=$p_0 \cdot L(i)$).

In S340 the CPU 40 determines whether the normalized reflected light value I(i) has reached a peak. When i is an odd number, the CPU 40 determines whether the normalized reflected light value I(i) begins to decrease after increasing from the initial value $I_0(i)$. If i is an even number, the CPU 40 determines whether the normalized reflected light value I(i) has begun to increase after decreasing from the initial value $I_0(i)$. Until the normalized reflected light value I(i) has reached the peak (S340: NO), the CPU 40 repeats the processes of S330 and S340 to calculate and monitor the normalized reflected light value I(i).

If the normalized reflected light value I(i) reaches the peak (S340: YES), then in S350 the CPU 40 ends the $i^{th}$ test vapor deposition operation. Specifically, the CPU 40 closes the shutter 16 and halts operations of the electron gun 12. If the i is an odd number, the CPU 40 also closes the oxygen supply valve 8.

In S360 the CPU 40 stores the peak quantity of reflected light Im(i) of the normalized reflected light value I(i) detected in S340 in the RAM 42.

In S370 the CPU 40 determines whether the variable i is equivalent to the total layer number N (20 in this case). If the variable i is less than N (S370: NO), then in S380 the variable i is incremented by one. The CPU 40 then returns to S320 to perform the next test vapor deposition.

Each time the CPU 40 begins a test vapor deposition operation, the monitor glass substrate M is replaced with a new monitor glass substrate M that has not been subjected to vapor deposition.

After completing all of test vapor deposition operations (S370: YES), the CPU 40 halts the evacuation pump 6 in S390 and stops driving the measuring light source 30 and the reflected light sensor 32.

Figure 16:
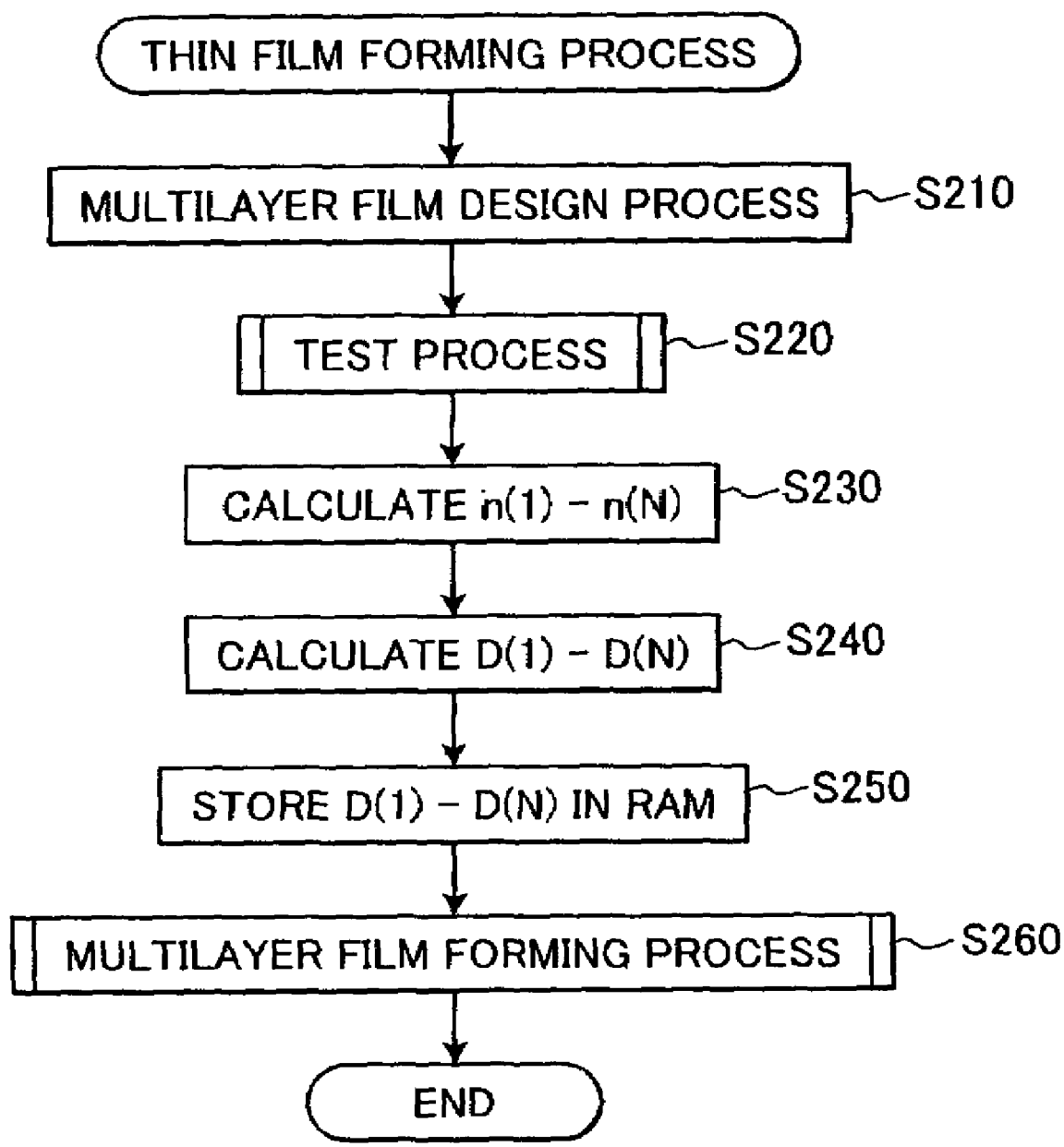
FIG. 16 is a flowchart showing steps in a thin film forming process according to the first embodiment.

Next, the program returns to S230 of FIG. 16.

In S230 the CPU 40 calculates Equations (8) and (9) based on the peak quantities of reflected light Im(1)-Im(N) obtained during all N test vapor deposition operations to obtain the refractive index n(1)-n(N) for the thin films formed by the N test vapor deposition operations. For example, if the resultant peak quantities of reflected light Im(1)-Im(20) have the values shown in FIG. 18, then the refractive index n(1)-n(N) are calculated as indicated in the table.

In S240 the CPU 40 calculates Equation (7) based on the optical thicknesses A(1)-A(N) computed in S210 and the refractive indexes n(1)-n(N) computed in S230 to calculate the target light quantities D(1)-D(N). For example, if the optical thicknesses A(1)-A(N) (where N=20 in this case) are determined to be 150 nm in S210, then the target light quantities D(1)-D(20) are computed as shown in FIG. 18.

In S250 the CPU 40 stores the target light quantities D(1)-D(N) in the ROM 44.

In S260 the CPU 40 executes the multilayer film forming process shown in FIG. 13 by controlling the vacuum deposition device 2. Specifically, after the substrate K intended for vapor deposition is held in the substrate loading dome 20, the CPU 40 begins evacuating the vacuum chamber 34 in S10. In S20-S140 a multilayer film including $1^{st}$-$N^{th}$ thin film layers is formed based on the target light quantities D(1)-D(N) determined in S220-S250. After forming all N layers of the multilayer film, the thin film forming process ends.

In the above description, the refractive index of each layer for both materials $TiO_2$ and $SiO_2$ is set individually in the test process, and data for target quantities of light is created based on this refractive index. However, since variations in the refractive index of $SiO_2$ are not large, as shown in FIG. 14, the refractive index for each $SiO_2$ layer may be considered a fixed value of 1.45, as described in the comparative example of FIG. 12. In this case, the CPU 40 calculates Equation (7) in S240 based on refractive index values n(2)=n(4) . . . =1.45 and optical thickness values A(2), A(4), . . . to be set as target light quantities D(2), D(4), . . . . If the optical thickness values A(1)-A(N) for all layers are equivalent to each other, for example, then the target light quantities D(2), D(4), . . . may all be set to the same value, as shown in FIG. 12. It is possible to determine a target quantities of light data by setting reflective indexes individually for each layer of only the $TiO_2$ material. However, when the reflective indexes are determined individually only for each layer of the $TiO_2$ material, the operation for alternately depositing $TiO_2$ and $SiO_2$ in the test process of S220 is performed a total of N times, as described above. This is because it is necessary to carry out the test process for approximately the same amount of time as in the multilayer film forming process in order to produce the same degree of evacuation as that of the multilayer film forming process. In S230-S240, the refractive index n(i) and the target light quantity D(i) are determined only for layers of $TiO_2$.

The above description is made for the embodiment in which the optical thickness A(i) for each layer to be formed is more than or equal to $\lambda/4$ and less than or equal to $\lambda/2$. Hence, the vapor deposition operation is halted when the reflected light value I(i) reaches the target light quantity D(i) the first time after passing the first peak. However, if the optical thickness A(i) for each layer to be formed is more than $\lambda/2$, then the number of times that the normalized reflected light value I(i) reaches a peak (maximum or minimum peak) may be counted, and the vapor deposition operation may be halted when the reflected light value I(i) first reaches the target light quantity D(i) after passing a required m number of peaks corresponding to the optical thickness A(i). In other words, in S70 (FIG. 13), the CPU 40 determines whether the reflected light value I(i) has reached a peak (maximum or minimum peak) exactly the required m number of times. If the reflected light value I(i) has reached a peak the required m number of times, the CPU 40 may determine Yes in S70 and advance to S80. Here, the required m number of times is an integer more than or equal to 1 that satisfies the inequality $0 \leq A(i) - m \cdot \lambda/4 < \lambda/4$. For example, if $\lambda/2 \leq A(i) < 3\lambda/4$, then the required m number of times is equal to 2. In any case, a bandpass filter capable of being provided in the measuring light source 30 should be selected such that the optical thickness A(i) of each layer to be formed is at least more than or equal to one-fourth the wavelength $\lambda$ of the measuring light.

Second Embodiment

A method for forming thin films and apparatus therefor according to a second embodiment of the present invention will be described with reference to FIGS. 19-21.

In the first embodiment described above, the control device 4 executed a test process to generate a target light quantity D(i). However, in the second embodiment, the test process is not performed.

Further, since the variations in the refractive index for $SiO_2$ are not substantially large, the refractive indexes n(2), n(4), . . . for each layer obtained by all vapor deposition operations are set to the same value 1.45, as in the comparative example of FIG. 12. The target light quantities D(2), D(4), . . . are set to values obtained by inserting the refractive indexes n(2)=n(4)= . . . =1.45 and desired optical thicknesses A(2), A(4), . . . into Equation (7) (such as 73.338, as shown in FIG. 12).

For the $TiO_2$ material, on the other hand, after completing the $1^{st}$, $3^{rd}$, . . . vapor deposition operation (the $i^{th}$ vapor deposition operation, where i is an odd number), the target light quantity D(i+2) to be used in the next $(i+2)^{th}$: $3^{rd}$, $5^{th}$, . . . ) vapor deposition operation is determined.

Figure 19:
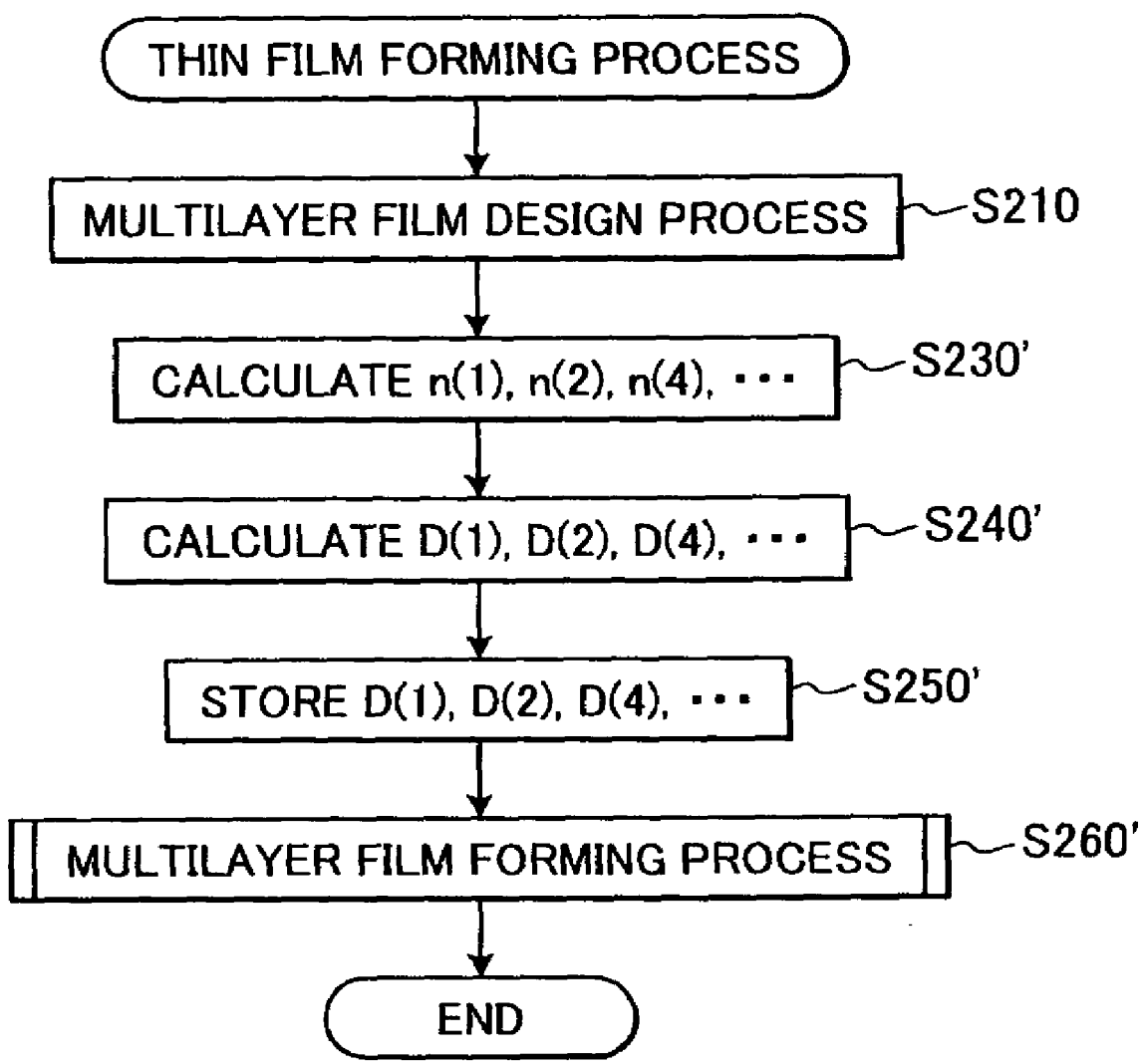
FIG. 19 is a flowchart showing steps in a thin film forming process according to a second embodiment of the present invention.
Figure 20:
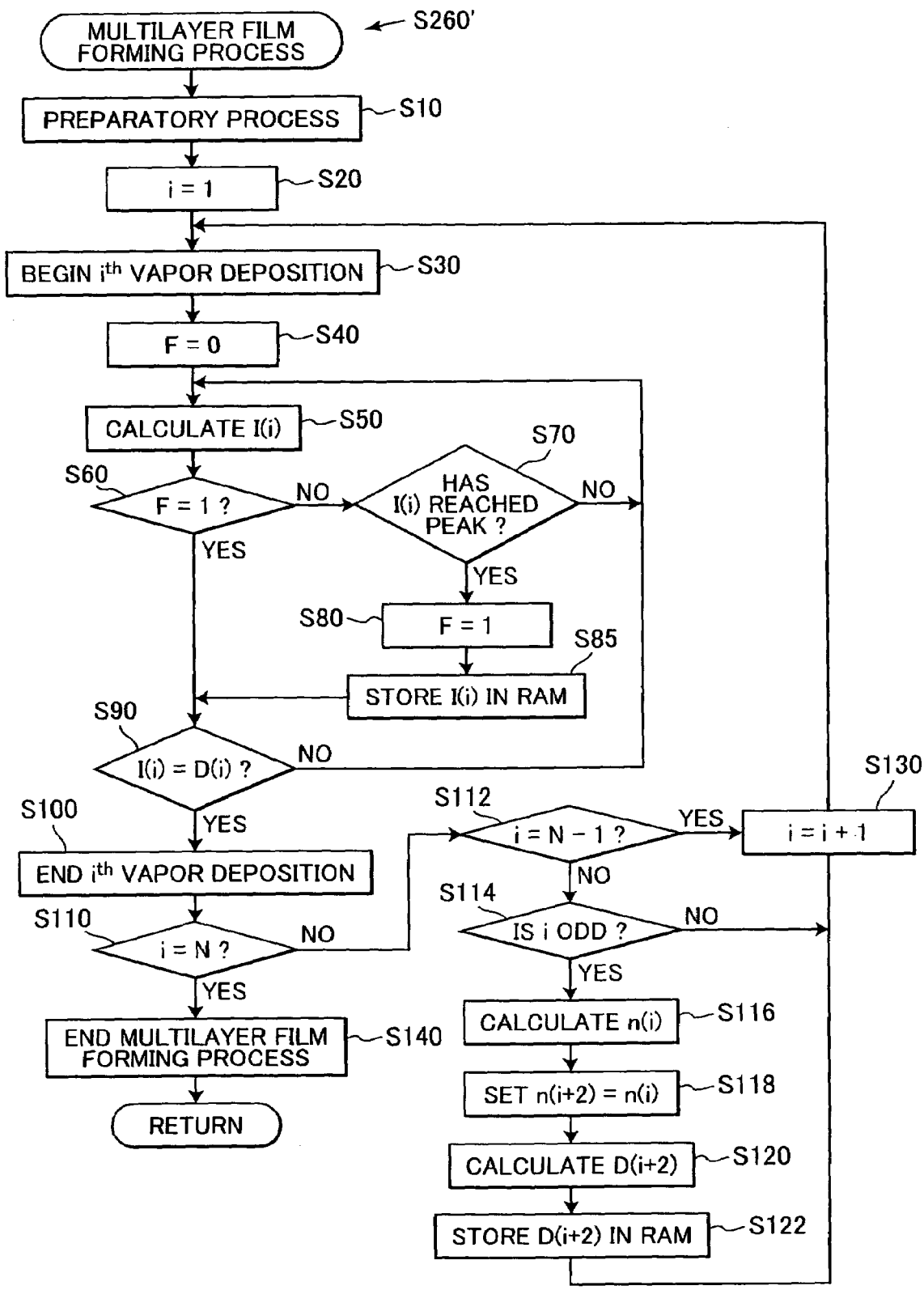
FIG. 20 is a flowchart showing steps in a multilayer film forming process performed in the thin film forming process of FIG. 19.

In the present embodiment, a thin film forming program shown in FIG. 19 and a multilayer film forming program shown in FIG. 20 are stored in the ROM 44 or the hard disk 46 of the control device 4.

Except for the points mentioned above, the construction and operations of the thin film forming apparatus 1 in the present embodiment are identical to those in the first embodiment.

The thin film forming operation of the thin film forming apparatus 1 according to the present embodiment will be described with reference to FIGS. 19 and 20.

When the thin film forming operation begins, first the multilayer film design process of S210 is performed in the same manner as described in the first embodiment.

In the following description, similar to the first embodiment, the user inputs an approximate refractive indexes nL (1.45) and nH (2.245) for the $SiO_2$ and $TiO_2$, respectively, a total layer number N (N=20), and an approximate optical thickness a(i)=150 nm for each layer, and the CPU 40 calculates the optical thickness A(i) ($1 \leq i \leq N$) as 150 nm based on these values.

After completing the multilayer film designing process of S210, in S230' the CPU 40 sets the refractive index n(1) for the $1^{st}$ layer to nH (2.245) and sets the refractive indexes n(2), n(4), ... for the $2^{nd}$, $4^{th}$, layers to nL (1.45). In S240' the CPU 40 obtains the target light quantity D(1) by calculating Equation (7) based on the refractive index n(1) and the optical thickness A(1) for the $1^{st}$ layer. In this case, as in the case of FIG. 12, target light quantity D(1) becomes 75.171. The CPU 40 also obtains the target light quantity D(2), D(4), ... by calculating Equation (7) based on the refractive indexes n(2), n(4), ... and the optical thicknesses A(2), A(4), .... In this case, as in the case of FIG. 12, all D(2), D(4), ..., become 73.338.

In S250' the CPU 40 stores these target light quantities D(1), D(2), D(4), ... in the ROM 44.

Next, the CPU 40 controls the vacuum deposition device 2 to perform the multilayer film forming process of S260'.

In the multilayer film forming process of S260', the processes of S10-S80 shown in FIG. 20 are executed as described in the first embodiment. If the normalized reflected light value I(i) reaches a peak (S70: YES), then the Flag F is set to 1 in S80, and in S85 the CPU 40 stores the peak quantity of reflected light Im(i) in the RAM 42 and advances to S90.

Next, S90-S110 are executed as described in the first embodiment.

In S110 the CPU 40 determines whether the variable i has reached the total layer number N (20 in this case). If the variable i has not reached the total layer number N (S110: NO), then in S112 the CPU 40 determines whether the variable i has reached a number N−1, one less than the total number of layers (19 in this case). If the variable i has not reached the N−1 (S112: NO), then in S114 the CPU 40 determines whether the i is an odd number. If the i is an odd number (S114: YES), then in S116 the CPU 40 calculates the refractive index n(i) for the layer formed in the current ($i^{th}$) vapor deposition operation by calculating the above Equations (8) and (9) based on the peak quantity of reflected light Im(i) stored in S85.

In S118 the CPU 40 sets that the refractive index n(i+2) for the layer to be formed in the i+$2^{th}$ vapor deposition operation is equivalent to the refractive index n(i).

In S120 the CPU 40 obtains the target light quantity D(i+2) to be used in the i+$2^{th}$ vapor deposition operation by solving Equation (7) based on the refractive index n(i+2) set in S118 and the optical thickness A(i+2).

In S122 the CPU 40 stores the target light quantity D(i+2) in the RAM 42.

Subsequently, the variable i is incremented by one in S130.

If the variable i has reached N−1 in S112 (S112: YES), then the CPU 40 jumps directly to S130. Similarly, if the variable i is an even number in S114 (S114: NO), then the CPU 40 jumps directly to S130.

Next, the CPU 40 returns to S30 to perform the next vapor deposition operation.

After completing the $N^{th}$ vapor deposition operation (S110: YES), the CPU 40 ends the multilayer film forming process in S140 and ends the thin film forming process as in the first embodiment.

Hence, in S90 the reflected light values I(1), I(2), I(4), ... for the $1^{st}$ layer and the even-numbered layers ($2^{nd}$ layer, $4^{th}$ layer, ... ) are compared to the target light quantities D(1), D(2), D(4), ... stored in the RAM 42, respectively. Alternatively, the reflected light value I(3), I(5), ... for all odd-numbered layers other than the $1^{st}$ layer ($3^{rd}$ layer, $5^{th}$ layer, ... ) are compared to the target light quantities D(3), D(5), ... stored in the RAM 42 in S122 after completing the vapor deposition operation of two layers earlier.

As described above, prior to beginning the multilayer film forming process (S260') in the present embodiment, the target light quantities D(1), D(2), D(4), ... are set to initial values. First, the first vapor deposition operation is performed in the multilayer film forming process. The first vapor deposition operation is then ended at the point that the normalized reflected light value I(1) reaches the value of target light quantity D(1) after peaking. The refractive index n(1) is determined from the first film formed in this vapor deposition operation. As shown in FIG. 21, the refractive index n(3) for a thin film formed in the $3^{rd}$ vapor deposition operation, which is the next operation performed using the same material, can be estimated to be equal to the refractive index n(1). Therefore, the target light quantity D(3) is calculated based on the refractive index n(3) and the optical thickness A(3). Subsequent calculations are performed in the same way, obtaining the refractive index n(i) for a thin film formed in an odd-numbered ($i^{th}$) vapor deposition operation based on the peak quantity of reflected light Im(i) obtained in the odd-numbered ($i^{th}$) vapor deposition operation. The refractive index n(i+2) for a film formed in the next vapor deposition operation using the same material (i+$2^{th}$ vapor deposition operation) is set equivalent to the refractive index n(i). The target light quantity D(i+2) is then set based on the refractive index n(i+2) and the optical thickness A(i+2).

According to the present embodiment, it is possible to obtain the target light quantity D during the multilayer film forming process without performing the test process. Hence, the overall thin film forming process can be simplified.

In the above description, after an odd-numbered ($i^{th}$) vapor deposition operation is completed, the target light quantity D(i+2) to be used in the i+$2^{th}$ vapor deposition operation is calculated and stored (S116-S122) before beginning the i+$1^{th}$ vapor deposition operation (S130, S30). However, the i+$1^{th}$ vapor deposition operation may be performed at the same time the target light quantity used in the i+$2^{th}$ vapor deposition operation is being calculated and stored. Specifically, when i is not equal to N in S110, the CPU 40 may advanced to S30 via S130 while simultaneously performing the processes in S112-S122.

Further, in the above description, target quantity of light data is generated by assuming the refractive index of a thin film obtained in an odd-numbered vapor deposition operation is equivalent to the refractive index of a thin film that will be obtained in the next odd-numbered vapor deposition operation. However, another refractive index may be obtained by correcting the refractive index of a thin film obtained in an odd-numbered vapor deposition operation using a prescribed coefficient with consideration for changes of refractive indexes. And the target quantity of light data may be then obtained by assuming the another refractive index is equivalent to the refractive index of a thin film that will be obtained in the next odd-numbered vapor deposition operation. For example, the target quantity of light data may be generated by multiplying a prescribed coefficient by the refractive index of the thin film obtained in an odd-numbered vapor deposition operation and setting the resulting product as the refractive index of the thin film to be obtained in the next odd-numbered vapor deposition operation.

Further, when a multilayer film by alternately forming films of the two materials $TiO_2$ and $SiO_2$ in the above description is formed, a target quantity of light data is generated only for the material $TiO_2$ by estimating the refractive index of the next layer of $TiO_2$ to be formed based on the refractive index of the layer formed in the current vapor deposition operation. However, target quantities of light data may be created for both the $TiO_2$ and the $SiO_2$, respectively, by setting the refractive index of the layer formed in the next vapor deposition based on the refractive indexes of the layers of $TiO_2$ and $SiO_2$ to be formed in the current vapor deposition operation. In this case, only the refractive indexes n(1) and n(2) for the first and second layers are set in S230' to the approximate values for the refractive index inputted by the user. In S240' only the target light quantities D(1) and D(2) for the $1^{st}$ and $2^{nd}$ layers are set based on the approximate n(1) and n(2) for refractive indexes set in S230'. The determination step S114 is deleted from the multilayer film forming process (S260). And the CPU 40 always advances to S116 if S112 has a NO determination. In S116-S120 after completing the $1^{st}$ vapor deposition operation, the refractive index n(1) for the actually formed $1^{st}$ layer is calculated based on the peak quantity of reflected light Im(1) for the $1^{st}$ layer. And the refractive index n(3) for the $3^{rd}$ layer and the target light quantity D(3) for the $3^{rd}$ layer are then calculated. In S116-S120 after completing the $2^{nd}$ vapor deposition operation, the refractive index n(2) for the $2^{nd}$ layer that was actually formed is computed based on the peak quantity of reflected light Im(2) for the $2^{nd}$ layer. And the refractive index n(4) and target light quantity D(4) for the $4^{th}$ layer are then calculated. Hereafter, the same process may be performed to form layers of thin film while sequentially calculating the target light quantity D(i+2).

In the present embodiment, as in the first embodiment, a bandpass filter is selected in the measuring light source 30 in order that the optical thickness A(i) for each layer is more than or equal to one-fourth the wavelength λ of the measuring light. Further, if the optical thickness A(i) for each layer to be formed is more than λ/2, it is possible to count the timing on which the normalized reflected light value I(i) reaches its peak, and stop the vapor deposition operation when the normalized reflected light value I(i) first reaches the target light quantity D(i) after passing its peak a required m number of timings corresponding to the optical thickness A(i). That is, in S70 (FIG. 20), the CPU 40 determines if the normalized reflected light value I(i) has reached a peak exactly the required m number of times (maximum or minimum peak). The CPU 40 advances to S80 when the normalized reflected light value I(i) has reached the required m number of times (S70: YES). Here, the required m number of times is an integer more than or equal to 1 that satisfies the inequality $0 \leq A(i)-m \cdot \lambda/4 \leq \lambda/4$.

While the method for forming thin films and apparatus therefor according to the present invention has been described in detail with reference to specific embodiments thereof, it would be apparent to those skilled in the art that many modifications and variations may be made therein without departing from the spirit of the invention, the scope of which is defined by the attached claims.

For example, in the first embodiment, after performing the test process (S220), the refractive index n(i) is calculated for the layer i (S230), and the target light quantity D(i) is obtained based on the resultant refractive index n(i) (S240). However, after calculating the refractive index n(i) for each layer in S230, these refractive indexes n(i) can be plotted as shown in FIG. 14 to calculate an approximated curve that approximately connects the plotted points. Hence, the refractive index n(i) for each layer can be determined based on this approximated curve, and the target light quantity D(i) can be obtained using the above determined refractive index. With this method, it is possible to more accurately determine changes in the refractive index, enabling the multilayer film forming process (S260) to be controlled more precisely. For example, in the case of FIG. 14, the refractive index n(11) for the $11^{th}$ layer is obtained through calculation to be 2.259 (plotted point). However, the approximated curve indicates that the refractive index n(11) is 2.261. Accordingly, the target light quantity D(11) for the $11^{th}$ layer can be calculated in Equation (7) based on the refractive index 2.261.

In the first and second embodiments described above, Equation (1)-(9) have been provided with consideration only for reflection off the top surface of the monitor glass substrate M (the film-forming surface). However, when reflection off the back surface of the monitor glass substrate M (the non-film-forming surface) is considered, it is possible to define a more accurate reflection of measuring light reflected off the monitor glass substrate M. In this case, $R_{ef}$ expressed in the following Equation (10) can be defined as the reflectance of the thin film in place of the reflectance R defined in Equation (1).

$$R_{ef} = R + Rg \qquad (10)$$

Here, R is the reflectance defined in Equation (1), that is, the reflectance on the top surface of the monitor glass substrate M. Rg is the reflectance off the back surface of the monitor glass substrate M, expressed by $\{(n_0-n_g)/(n_0+n_g)\}^2$. Here, $n_0$ is the refractive index of a vacuum, while $n_g$ is the refractive index of the monitor glass substrate M. Therefore, Rg is a fixed value (about 0.0426) unaffected by the progress of vapor deposition.

When the reflectance $R_{ef}$ is defined in this way, the following Equations (11), (12), and (13) may be used in place of Equations (7), (8), and (9) in the thin film forming process of the first and second embodiments.

$$D(i) = P_0(i) \cdot (R(i) + Rg) \qquad (11)$$

wherein $R(i) = (r_1^2 + r_2^2 + 2r_1 r_2 \cos(4\pi A(i)/\lambda))/(1 + r_1^2 r_2^2 + 2r_1 r_2 \cos(4\pi A(i)/\lambda))$, $r_1 = (n(i) - n_g)/(n(i) + n_g)$, $r_2 = (n_0 - n(i))/(n_0 + n(i))$, $P_0(i) = I_0(i)/\{[(n_0 - n_g)/(n_0 + n_g)]^2 + Rg\} = I_0(i)/2Rg$, and $Rg = [(n_0 - n_g)/(n_0 + n_g)]^2 = 0.04$.

$I_0(i)$ is a prescribed initial value for normalized reflected light value I(i) (20 for a $TiO_2$ thin film and 90 for an $SiO_2$ thin film).

$$n(i) = n_g^{1/2} \cdot [\{1 + Rm'(i)^{1/2}\}/\{1 - Rm'(i)^{1/2}\}]^{1/2} \qquad (12)$$

Here, Rm'(i)=Rm(i)−Rg.

$$Rm(i) = Im(i)/P_0(i) \quad (13)$$
$$= Im(i) \cdot 2Rg/I_0(i)$$

When the thin film forming process of the first and second embodiments using the above Equations (11)-(13) in place of Equations (7)-(9) is executed, reflection on both surfaces of the monitor glass substrate can be considered, thereby more precisely controlling formation of the thin film.

Further, when considering multiple reflections occurring on both the front and back surfaces of the monitor glass substrate M, it is possible to determine the measuring light reflected off the monitor glass substrate M with more accuracy. In this case, the following Equation (14) may be used in place of Equation (1), wherein $R_{ef}$ may be defined as the reflectance of a thin film.

$$R_{ef}=(Rg+R-2RgR)/(1-RgR) \quad (14)$$

When $R_{ef}$ is defined in this way, the following Equations (15), (16), and (17) may be used in place of Equations (7), (8), and (9) in the thin film forming process of the $1^{st}$ and $2^{nd}$ embodiments.

$$D(i)=P_0(i)\cdot\{Rg+R(i)-2RgR(i)\}/\{1-RgR(i)\} \quad (15)$$

wherein $$R(i)=(r_1^2+r_2^2+2r_1r_2\cos(4\pi A(i)/\lambda))/(1+r_1^2r_2^2+2r_1r_2\cos(4\pi A(i)/\lambda)),$$

$$r_1=(n(i)-n_g)/(n(i)+n_g),$$

$$r_2=(n_0-n(i))/(n_0+n(i)),$$

$$P_0(i)=I_0(i)\cdot(1+Rg)/2Rg, \text{ and}$$

$$Rg=[(n_0-n_g)/(n_0+n_g)]^2=0.04.$$

$I_0(i)$ is a prescribed initial value for normalized reflected light value I(i) (20 for a $TiO_2$ thin film and 90 for a $SiO_2$ thin film).

$$n(i)=n_g^{1/2}\cdot[\{1+Rm'(i)^{1/2}\}/\{1-Rm'(i)^{1/2}\}]^{1/2} \quad (16)$$

Here, Rm'(i)=(Rm(i)−Rg)/(RgRm(i)+1−2Rg).

$$Rm(i) = Im(i)/P_0(i) \quad (17)$$
$$= \{2Rg \cdot Im(i)\}/\{(1 + Rg)\cdot I_0(i)\}$$

When the thin film forming process of the first and second embodiments is executed while using the above Equations (15)-(17) in place of Equations (7)-(9), the film formation can be controlled more accurately by considering multiple reflections on both surfaces of the monitor glass substrate.

In the embodiments described above, a measuring light is irradiated on the thin film and the amount of reflected light is then measured. However, it is possible to measure other distinctive quantities of the measuring light that indicate the effect on light irradiated on the thin film, such as the quantity of light transmitted through the thin film. In this case, the target light quantity data is also generated as data indicating the quantity of measuring light.

While the thin film is measured by irradiating a measuring light on the monitor glass substrate M, it is also possible to measure the thin film on the substrate by irradiating measuring light on the substrate K itself that is provided for forming the multilayer film. In this case, the monitor glass substrate M becomes unnecessary.

The amount of light irradiated from the measuring light source 30 may be kept constant.

The multilayer film to be formed is not limited to films formed alternately of two types of material, but may be formed by alternating three or more types of material.

The material for forming the thin film is not limited to $TiO_2$ and $SiO_2$. Any material can be vaporized to form a thin film. For example, a multilayer film may be formed by alternately vaporizing two or more of such materials as hafnium oxide ($HfO_2$), tantalum pentoxide ($Ta_2O_5$), zirconium oxide ($ZrO_2$), aluminum oxide ($Al_2O_3$), magnesium oxide (MgO), yttrium oxide ($Y_2O_3$), and cerium oxide ($CeO_2$). Niobium pentoxide ($Nb_2O_5$), bismuth oxide ($Bi_2O_3$), neodymium oxide ($Nd_2O_3$), antimony oxide ($Sb_2O_3$), scandium oxide ($Sc_2O_3$), tungsten oxide ($WO_3$), indium oxide ($In_2O_3$), tin oxide ($SnO_2$), and zinc oxide (ZnO) can be vaporized to form a thin film. Since the present invention can accurately control the optical thickness of each layer, an optical multilayer film having desired optical characteristics can be formed.

As with $TiO_2$, for example, vapor deposition of $HfO_2$ may be conducted while introducing oxygen. The refractive index of an $HfO_2$ thin film varies as the vapor deposition operations are repeated, as shown in FIG. 22. As described in the first and second embodiments, the refractive index n(i) for a thin film formed in each vapor deposition operation ($i^{th}$ vapor deposition operations, where $1 \leq i \leq N$) may be estimated individually in advance. A target light quantity D(i) can be generated based on the estimated refractive index n(i) and a desired optical thickness A(i).

When an oxide material having a larger refractive index, such as $TiO_2$ and $HfO_2$ is deposited, the vapor deposition is conducted while introducing oxygen gas. In contrast, oxygen is not introduced for oxide materials having a smaller refractive index, such as $SiO_2$. However, even if oxygen is not introduced, it is possible to perform more accurate vapor deposition processes for forming each layer by determining in advance individual refractive indexes n(i) for thin films to be formed in each vapor deposition process and obtaining target light quantities D(i) to be used in the vapor deposition processes based on the refractive indexes n(i).

Deposition materials other than oxides, such as magnesium fluoride ($MgF_2$) may also be used.

When using a deposition material other than an oxide, the vapor deposition process may be repeated while introducing a prescribed gas into the vacuum chamber. In such a case, the refractive indexes n(i) for thin films to be formed in each vapor deposition process can be determined individually in advance. And the target light quantities D(i) used in these processes can be created based on the refractive indexes n(i). Even when a gas is not introduced, the refractive indexes n(i) for thin films to be formed in each vapor deposition process can be determined in advance individually. And the target light quantities D(i) to be used in these processes may be obtained based on the refractive indexes n(i). Regardless of how the vapor deposition process is performed, if the refractive index of the thin film being formed varies as the vapor deposition process is repeatedly executed, it is preferable to set a refractive index for each layer individually and to obtain a target quantity of light data based thereon.

In the first embodiment, the refractive index n(i) obtained in each ($i^{th}$) test vapor deposition operation of the test process is assumed equivalent to the refractive index of the thin film to be formed in the corresponding ($i^{th}$) vapor deposition operation of the multilayer film forming process. And the target light quantity D(i) is found based on the above refractive index n(i) and a desired optical thickness A(i). However, it is also possible to assume the refractive index of a thin film to be formed in each ($i^{th}$) vapor deposition operation is a value approximately equivalent to the refractive index n(i) obtained in the corresponding ($i^{th}$) test vapor deposition operation, thereby obtaining the target light quantity D(i).

Similarly, in the second embodiment, the refractive index n(i) determined in each ($i^{th}$) vapor deposition operation of the multilayer film forming process is assumed equivalent to the refractive index of the thin film to be formed in the next ($i+2^{th}$) vapor deposition operation for the same material. And the target light quantity D(i+2) is then found based on this refractive index n(i+2) and a desired optical thickness A(i+2). However, it is also possible to assume that the refractive index n(i+2) for a thin film to be formed in the next ($i+2^{th}$) vapor deposition operation using the same material is the value which is approximately equivalent to the refractive index n(i) determined in each ($i^{th}$) vapor deposition operation, thereby obtaining the target light quantity D(i+2) based on this value.

INDUSTRIAL APPLICABILITY

The method for forming thin films and apparatus therefor according to the present invention may be used in a wide range of applications for manufacturing optical products, such as multilayer mirrors and multilayer filters.

The invention claimed is:

1. A method for forming a thin film by vapor deposition, comprising:
    forming a multilayer film that alternately repeats one time each a first material vapor deposition process and a second material vapor deposition process, the first material vapor deposition process being for vapor-depositing a first material to form a first thin film, and the second material vapor deposition process being for vapor-depositing a second material to form a second thin film, each of the first and second material vapor deposition processes being executed based on deposition control data stored in a deposition control data storage unit, and a measuring result obtained by measuring the first and second thin films to be formed with a prescribed measuring light, performance of the first and second material vapor deposition processes in total a prescribed number of times forming the multilayer film, the multilayer film having in total the prescribed number of layers alternating between the first thin film of the first material and the second thin film of the second material; and
    obtaining deposition control data, comprising: determining a refractive index for the first thin film to be formed in each of the first material vapor deposition processes individually prior to executing the corresponding first material vapor deposition process, and obtaining the deposition control data to be used in the corresponding first material vapor deposition process based on the determined refractive index prior to executing the corresponding first material vapor deposition process to store the deposition control data in the deposition control data storage unit, wherein
    the obtaining deposition control data comprises: generating a preliminary thin film and generating data, wherein the forming preliminary thin film alternately repeats one time each a first material preliminary vapor deposition process and a second material preliminary vapor deposition process, the first material preliminary vapor deposition process being for vapor-depositing a first material to form a first preliminary thin film, the second material preliminary vapor deposition process being for vapor-depositing a second material to form a second preliminary thin film, each of the first and second material preliminary vapor deposition processes being performed while measuring the corresponding one of the first and second preliminary thin film being formed with a prescribed measuring light, and the first and second material preliminary vapor deposition processes being performed a prescribed number of times in total; and
    the generating data comprises:
    determining the refractive index of the first preliminary thin film formed in each the first material preliminary vapor deposition process based on the preliminary measurements indicating measuring results of the first preliminary thin film formed in each the first material preliminary vapor deposition process;
    obtaining an approximated curve indicating changes in the refractive index based on the refractive index of the first thin films obtained in the first material preliminary vapor deposition steps;
    determining the refractive index of the first thin film to be obtained in the corresponding first material vapor deposition step based on the approximated curve; and
    obtaining the deposition control data to be used in the corresponding first material vapor deposition step based on the determined refractive index of the first thin film and a desired optical thickness for the first thin film to be formed in the corresponding first material vapor deposition step.

2. A method for forming a thin film by vapor deposition comprising:
    providing a substrate and a monitor substrate in a vacuum chamber;
    vapor-depositing a first material to form a first preliminary thin film;
    vapor-depositing a second material to form a second preliminary thin film, the second material being different from the first material;
    repeating the formation of the first preliminary thin film and the formation of the second preliminary thin film alternately more than once to form a preliminary multilayer film on the substrate, the preliminary multilayer film having N layers of first preliminary thin films, N being an integer more than 1; and
    measuring a refractive index of an i-th first preliminary thin film formed on the monitor substrate in an i-th formation of the first preliminary thin film with prescribed measuring light, i being all integers from 1 through N;
    generating an i-th deposition control data to be used for an i-th depositing of the first material, based on the determined refractive index of the i-th first preliminary thin film, the i-th deposition control data being stored in a deposition control data storage unit;
    providing another substrate within the vacuum chamber;
    vapor-depositing the first material under the i-th deposition control data to form a first thin film,
    vapor-depositing the second material to form a second thin film,
    depositing a third material to the multilayer substrate to form a third thin film, and
    repeating the vapor-depositing of the first material, the vapor-depositing of the second material, and the depositing of the third material alternately more than once to form a multilayer film having N layers of the first thin films, wherein the i-th deposition control data are used in numerical order.

3. A method for forming a thin film by vapor deposition comprising:

provide a substrate and a monitor substrate in a vacuum chamber;

vapor-depositing a first material to form a first preliminary thin film;

vapor-depositing a second material to form a second preliminary thin film, the second material being different from the first material;

repeating the formation of the first preliminary thin film and the formation of the second preliminary thin film alternately more than once to form a preliminary multilayer film on the substrate, the preliminary multilayer film having N layers of first preliminary thin films, N being an integer more than 1; and measuring a refractive index of an i-th first preliminary thin film formed on the monitor substrate in an i-th formation of the first preliminary thin film with prescribed measuring light, i being all integers from 1 though N;

generating an i-th deposition control data to be used for an i-th depositing of the first material, based on the determined refractive index of the i-th first preliminary thin film, the i-th deposition control data being stored in a deposition control data storage unit, the step of generating the i-th deposition control data comprising:

obtaining an approximated curve indicating changes in the refractive index based on N refractive indices of N first preliminary thin films obtained in N formations of the first preliminary thin film;

determining the refractive index of the i-th first thin film to be obtained in the i-th depositing of the first material based on the approximated curve; and obtaining the deposition control data to be used in the i-th depositing of the first material based on the determined refractive index of the i-th first thin film and a desired optical thickness of the i-th first thin film to be formed in the i-th depositing of the first material;

providing another substrate within the vacuum chamber;

vapor-depositing the first material under the i-th deposition control data to form a first thin film, vapor-depositing the second material to form a second thin film, and repeating the vapor-depositing of the first material and the vapor-depositing of the second material alternately more than once to fonn a multilayer film having N layers of the first thin films, wherein the i-th deposition control data are used in numerical order, wherein the deposition control data to be used in the i-th depositing of the first material is generated based on the measured refractive index of the i-th first preliminary thin film fonned in the i-th formation of the first preliminary thin film and a desired optical thickness of the i-th first thin film to be formed in the i-th depositing of the first material.

* * * * *